(12) United States Patent
Kuramoto et al.

(10) Patent No.: US 11,624,902 B2
(45) Date of Patent: Apr. 11, 2023

(54) WAFER INSPECTION METHOD AND WAFER

(71) Applicant: HAMAMATSU PHOTONICS K.K., Hamamatsu (JP)

(72) Inventors: Yumi Kuramoto, Hamamatsu (JP); Katsumi Shibayama, Hamamatsu (JP); Takashi Kasahara, Hamamatsu (JP); Masaki Hirose, Hamamatsu (JP); Toshimitsu Kawai, Hamamatsu (JP); Hiroki Oyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 227 days.

(21) Appl. No.: 16/765,529

(22) PCT Filed: Nov. 9, 2018

(86) PCT No.: PCT/JP2018/041721
§ 371 (c)(1),
(2) Date: May 20, 2020

(87) PCT Pub. No.: WO2019/102875
PCT Pub. Date: May 31, 2019

(65) Prior Publication Data
US 2020/0310104 A1    Oct. 1, 2020

(30) Foreign Application Priority Data
Nov. 24, 2017    (JP) .............................. JP2017-226094

(51) Int. Cl.
*G02B 26/00*    (2006.01)
*G01N 21/45*    (2006.01)
(Continued)

(52) U.S. Cl.
CPC ........... *G02B 26/001* (2013.01); *G01N 21/45* (2013.01); *G01N 21/9505* (2013.01);
(Continued)

(58) Field of Classification Search
CPC .. G02B 26/001; G01N 21/45; G01N 21/9505; G01N 2201/06113; H01L 27/1446; H01L 31/0203; H01L 31/02165
See application file for complete search history.

(56) References Cited

U.S. PATENT DOCUMENTS 7,317,536 B2 *    1/2008    Rafac .................... G01J 3/0237
                                                             356/519
7,330,266 B2 *    2/2008    Guerineau ................ G01J 3/26
                                                             356/519
(Continued)

FOREIGN PATENT DOCUMENTS

CN       1292746 A      4/2001
CN       1717784 A      1/2006
(Continued)

OTHER PUBLICATIONS

International Preliminary Report on Patentability dated Jun. 4, 2020 for PCT/JP2018/041721.

(Continued)

*Primary Examiner* — Gregory M Desire
(74) *Attorney, Agent, or Firm* — Faegre Drinker Biddle & Reath LLP

(57) ABSTRACT

A wafer includes a substrate layer, a first mirror layer having a plurality of two-dimensionally arranged first mirror portions, and a second mirror layer having a plurality of two-dimensionally arranged second mirror portions. In the wafer, a gap is formed between the first mirror portion and the second mirror portion so as to form a plurality of Fabry-Perot interference filter portions. A wafer inspection (Continued)

method according to an embodiment includes a step of performing faulty/non-faulty determination of each of the plurality of Fabry-Perot interference filter portions, and a step of applying ink to at least part of a portion overlapping the gap when viewed in a facing direction on the second mirror layer of the Fabry-Perot interference filter portion determined as faulty.

7 Claims, 20 Drawing Sheets

(51) Int. Cl.
*G01N 21/95* (2006.01)
*H01L 27/144* (2006.01)
*H01L 31/0203* (2014.01)
*H01L 31/0216* (2014.01)

(52) U.S. Cl.
CPC ...... *H01L 27/1446* (2013.01); *H01L 31/0203* (2013.01); *H01L 31/02165* (2013.01); *G01N 2201/06113* (2013.01)

(56) References Cited

U.S. PATENT DOCUMENTS

| | | | | |
|---|---|---|---|---|
| 7,444,012 | B2 * | 10/2008 | White | G01N 21/91 |
| | | | | 438/15 |
| 9,075,198 | B2 * | 7/2015 | Shinto | G02B 5/28 |
| 9,188,483 | B2 * | 11/2015 | Stein | G01J 3/06 |
| 9,651,770 | B2 * | 5/2017 | Shinto | G02B 5/28 |
| 9,952,031 | B1 * | 4/2018 | Hannigan | G01B 9/02043 |
| 2004/0188860 | A1 | 9/2004 | Tsai et al. | |
| 2005/0179460 | A1 | 8/2005 | Mizukami | |
| 2006/0066856 | A1 | 3/2006 | Cummings et al. | |
| 2007/0080989 | A1 | 4/2007 | Silverbrook | |
| 2008/0205746 | A1 | 8/2008 | Ko et al. | |
| 2010/0239157 | A1 | 9/2010 | O'Dell et al. | |
| 2017/0213796 | A1 | 7/2017 | Fischer | |
| 2020/0310104 | A1 * | 10/2020 | Kuramoto | H01L 31/02165 |

FOREIGN PATENT DOCUMENTS

| | | |
|---|---|---|
| CN | 1726431 A | 1/2006 |
| CN | 101174638 A | 5/2008 |
| CN | 101316652 A | 12/2008 |
| CN | 101344662 A | 1/2009 |
| CN | 101369516 A | 2/2009 |
| CN | 101468565 A | 7/2009 |
| CN | 102404932 A | 4/2012 |
| CN | 202878772 U | 4/2013 |
| CN | 203243587 U | 10/2013 |
| CN | 104105331 A | 10/2014 |
| CN | 104698662 A | 6/2015 |
| CN | 104972766 A | 10/2015 |
| CN | 105393314 A | 3/2016 |
| CN | 105992964 A | 10/2016 |
| CN | 106427215 A | 2/2017 |
| CN | 107310281 A | 11/2017 |
| EP | 0901906 A1 | 3/1999 |
| EP | 1873812 A1 | 1/2008 |
| EP | 3106910 A1 | 12/2016 |
| JP | S47-043040 | 12/1972 |
| JP | H1-309345 A | 12/1989 |
| JP | H9-136276 A | 5/1997 |
| JP | H9-331225 A | 12/1997 |
| JP | H10-107098 A | 4/1998 |
| JP | 2002-033604 A | 1/2002 |
| JP | 2008-261692 A | 10/2008 |
| JP | 2013-506154 A | 2/2013 |
| JP | 2015-152713 A | 8/2015 |
| KR | 20170043261 A | 4/2017 |
| TW | 201413262 A | 4/2014 |
| TW | 201714290 A | 4/2017 |
| WO | WO-2011/036346 A1 | 3/2011 |

OTHER PUBLICATIONS

Fegley, C.R.; Montone, L.J.; Somloi, F.C.; Yokitis, J.E., "Automatic detection of ink-marked semiconductor chips", Jul. 1, 1980, p. 11-p. 12.

"GSI releases latest wafer-level chip marking technology", Electronics & Packaging, Jan. 2005 vol. 5,No. 1, p. 47.

* cited by examiner

Fig.17
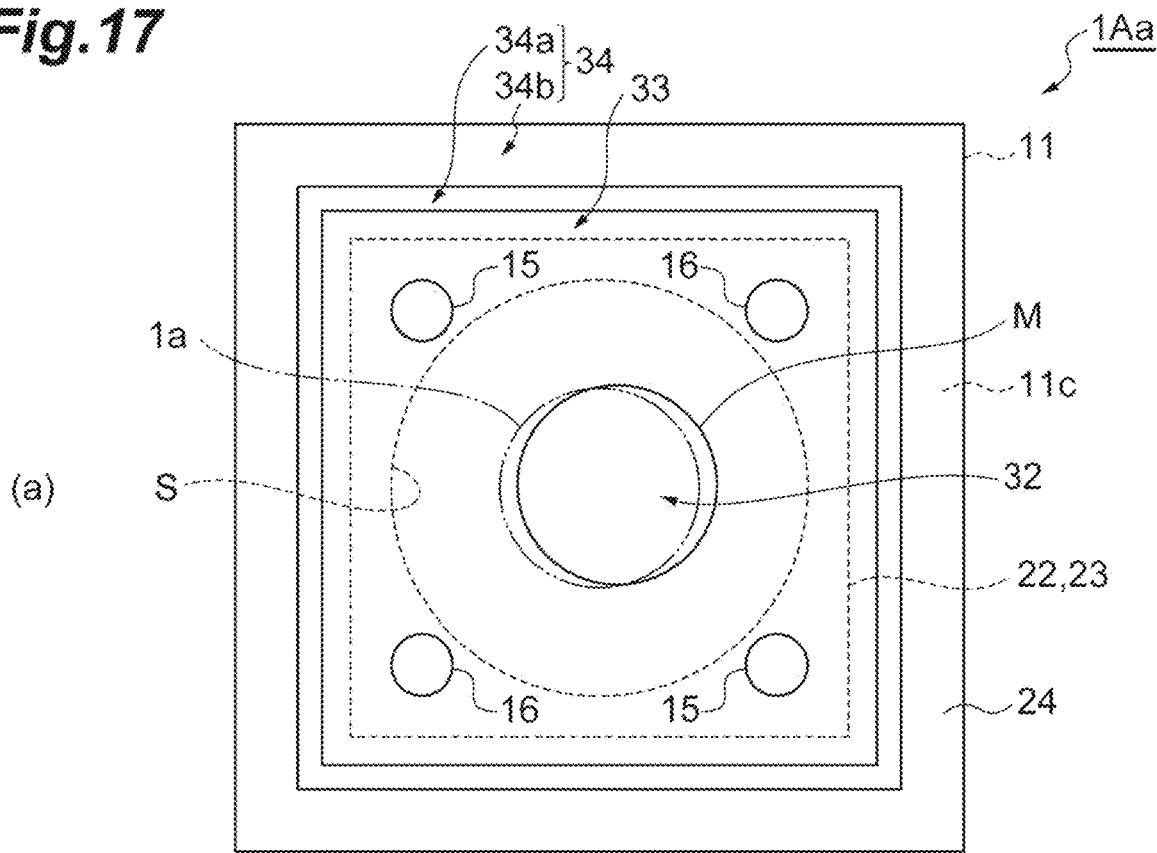
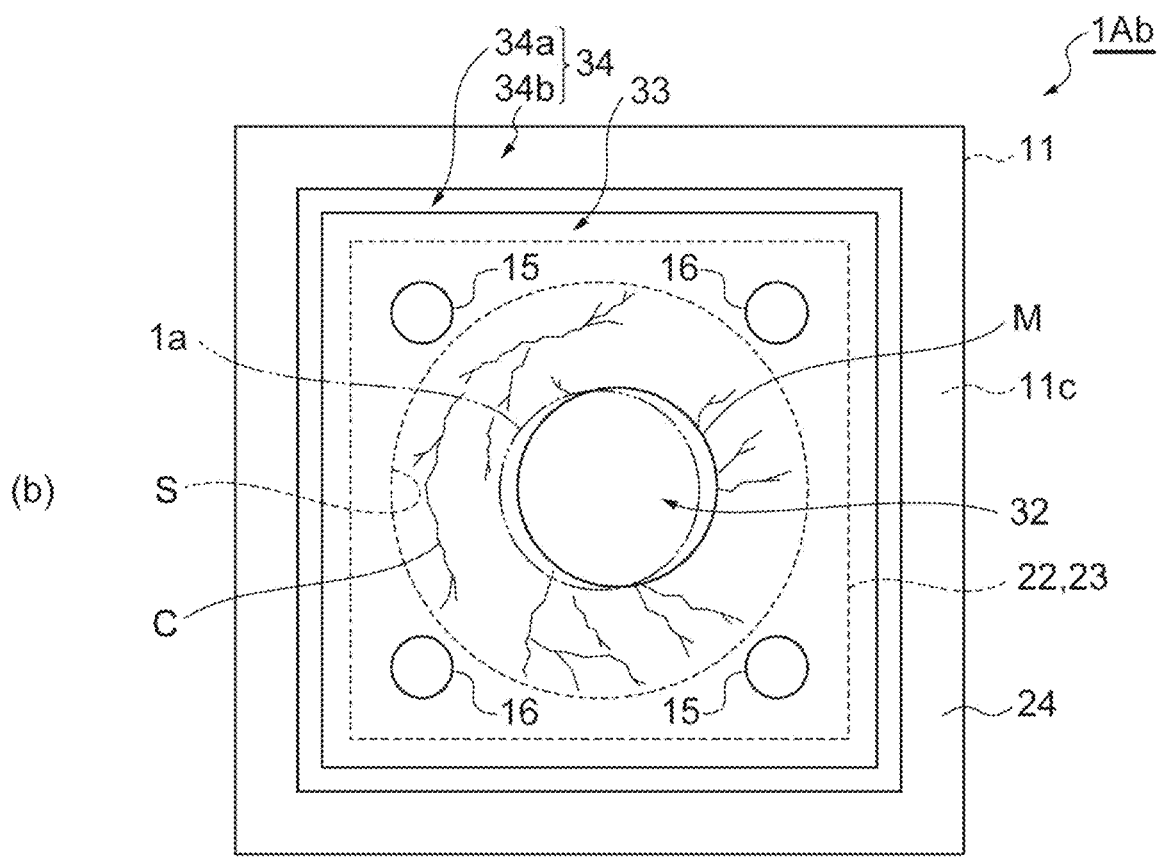

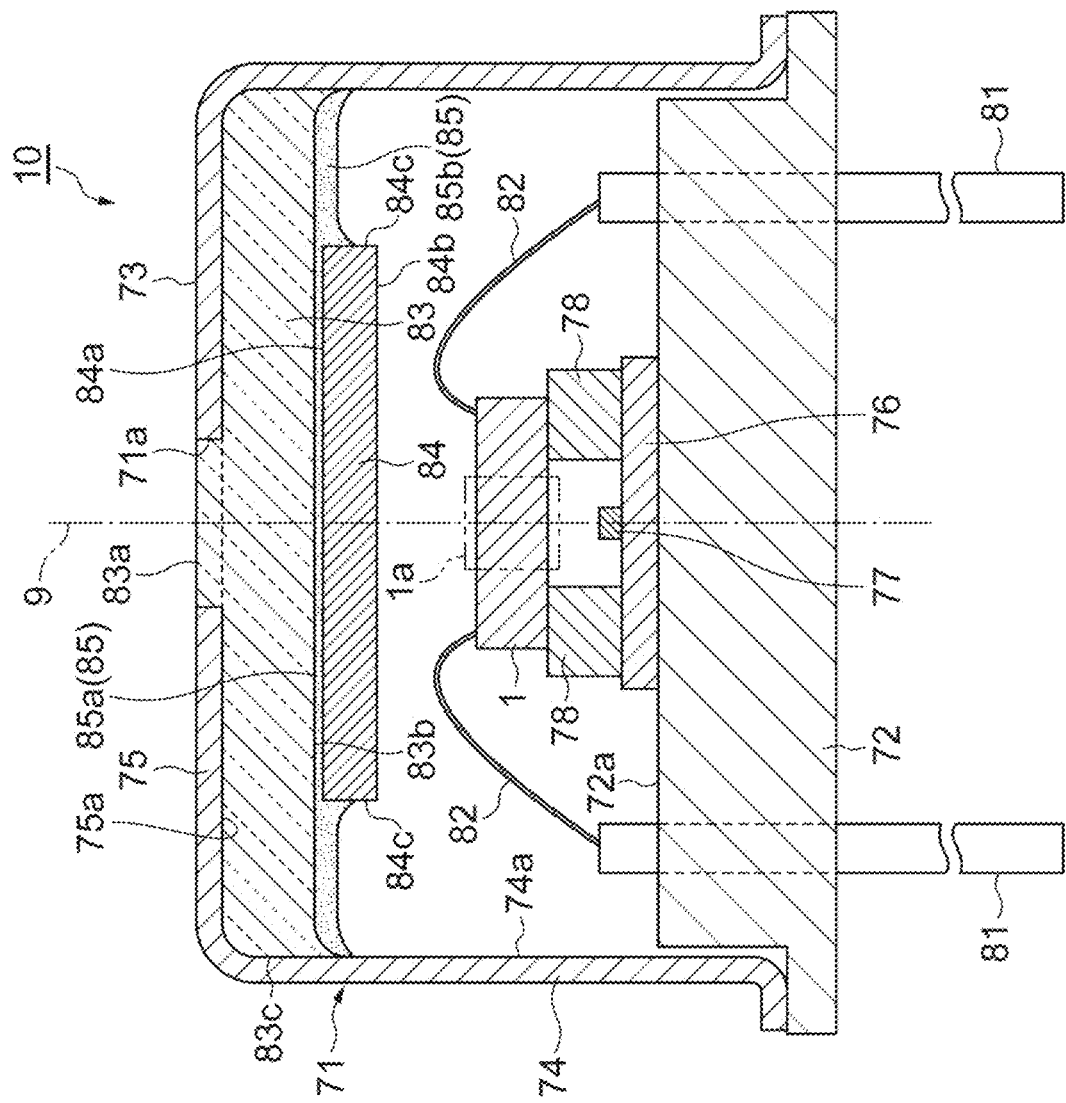

WAFER INSPECTION METHOD AND WAFER

TECHNICAL FIELD

The present disclosure relates to a wafer for obtaining a Fabry-Perot interference filter, and a wafer inspection method.

BACKGROUND ART

In the related art, a Fabry-Perot interference filter including a substrate, a fixed mirror and a movable mirror facing each other via a gap on the substrate is known (for example, refer to Patent Literature 1).

CITATION LIST

Patent Literature

Patent Literature 1: Japanese Unexamined Patent Publication No. 2013-506154

SUMMARY OF INVENTION

Technical Problem

Since the Fabry-Perot interference filter as described above is a fine structure, individually handling and inspecting singulated Fabry-Perot interference filters is not easy. Accordingly, it is difficult to improve inspection efficiency. Furthermore, it has been found that, when a Fabry-Perot interference filter with a broken movable mirror in a membrane shape exists in a state where a plurality of Fabry-Perot interference filters is integrated (for example, in a wafer state), particles might be generated from a broken portion of the Fabry-Perot interference filter and the particles might scatter onto other Fabry-Perot interference filters to bring about adverse effects.

Therefore, the present disclosure aims to provide a wafer inspection method and a wafer capable of inhibiting a broken Fabry-Perot interference filter from adversely affecting other Fabry-Perot interference filters while improving inspection efficiency.

Solution to Problem

A wafer inspection method according to one aspect of the present disclosure includes: a step of preparing a wafer including a substrate layer having a first surface and a second surface opposite to the first surface, a first mirror layer having a plurality of first mirror portions two-dimensionally arranged on the first surface, and a second mirror layer having a plurality of second mirror portions two-dimensionally arranged on the first mirror layer, in which a gap is formed between a portion of the first mirror layer at least including the first mirror portion and a portion of the second mirror layer at least including the second mirror portion facing each other so as to form a plurality of Fabry-Perot interference filter portions in which a distance between the first mirror portion and the second mirror portion facing each other varies by an electrostatic force; a step of performing faulty/non-faulty determination of each of the plurality of Fabry-Perot interference filter portions; and a step of applying ink to at least part of a portion overlapping the gap when viewed in a direction in which the first mirror portion and the second mirror portion face each other on the second mirror layer of the Fabry-Perot interference filter portion determined as faulty in the step of performing faulty/non-faulty determination.

In the wafer inspection method according to one aspect of the present disclosure, inspection (faulty/non-faulty determination) of each of the plurality of Fabry-Perot interference filter portions is performed in a state where each of the plurality of Fabry-Perot interference filter portions to be a Fabry-Perot interference filter is integrated (that is, in a wafer state). This makes it possible to perform the inspection more efficiently as compared with a case of individually inspecting the Fabry-Perot interference filters singulated by cutting the wafer. Furthermore, in the inspection method, ink is applied to at least part of a weak portion having a membrane structure (that is, the portion overlapping the gap when viewed in a direction in which the first mirror portion and the second mirror portion face each other on the second mirror layer; hereinafter, simply referred to as a "membrane portion") on the Fabry-Perot interference filter portion determined as faulty. Accordingly, in a case where the membrane portion is broken, it is possible to suppress curling of the broken portion and generation of particles from the broken portion. Furthermore, even in a case where the membrane portion is not broken, the possibility of future breakage of the membrane portion can be reduced by reinforcing the membrane portion with ink. As described above, according to the above-described wafer inspection method, it is possible to inhibit a broken Fabry-Perot interference filter from adversely affecting other Fabry-Perot interference filters while improving inspection efficiency.

The at least part of the portion to which the ink is applied may include a through-hole formed from a surface of the second mirror layer opposite to the first mirror layer to the gap. This allows the ink to penetrate from the surface of the second mirror layer to the inside via the through-hole. As a result, the second mirror layer is reinforced by the ink, making it possible to effectively suppress the curling of the broken portion of the second mirror layer, generation of particles from the broken portion, or the like. Furthermore, even in a case where the membrane portion of the Fabry-Perot interference filter portion determined as faulty is not broken, it is possible to effectively reduce the possibility of future breakage of the membrane portion by the ink penetrating the gap.

In the step of applying ink, the ink may be sequentially applied to one or more Fabry-Perot interference filter portions determined as faulty after completion of the faulty/non-faulty determination of all the Fabry-Perot interference filter portions in the step of performing faulty/non-faulty determination. In this case, it is possible to collectively perform ink marking on the one or more Fabry-Perot interference filter portions determined as faulty after completion of inspection (faulty/non-faulty determination) for all the Fabry-Perot interference filter portions, making it possible to perform the marking efficiently.

In the step of applying ink, the ink may be applied to one Fabry-Perot interference filter portion every time the one Fabry-Perot interference filter portion is determined as faulty in the step of performing faulty/non-faulty determination. In this case, every time of discovery of a Fabry-Perot interference filter portion determined as faulty in the inspection, marking is immediately performed on the Fabry-Perot interference filter portion. This makes it possible to immediately apply the ink to a Fabry-Perot interference filter portion that can adversely affect other Fabry-Perot interference filter portions (for example, a Fabry-Perot interference filter portion that is broken and might generate particles). As a result, adverse effects on other Fabry-Perot interference filter portions can be further effectively suppressed.

The viscosity of the ink before curing may be in a range from 500 cP to 50000 cP. With the use of the ink having such viscosity, it is possible to preferably suppress the curling of the broken portion of the second mirror layer and the generation of particles from the broken portion.

A wafer according to one aspect of the present disclosure includes: a substrate layer having a first surface and a second surface opposite to the first surface; a first mirror layer having a plurality of first mirror portions two-dimensionally arranged on the first surface; and a second mirror layer having a plurality of second mirror portions two-dimensionally arranged on the first mirror layer, in which a gap is formed between a portion of the first mirror layer at least including the first mirror portion and a portion of the second mirror layer at least including the second mirror portion facing each other so as to form a plurality of Fabry-Perot interference filter portions in which a distance between the first mirror portion and the second mirror portion facing each other varies by an electrostatic force, and ink is applied to at least one faulty Fabry-Perot interference filter portion while the ink is not applied to at least one non-faulty Fabry-Perot interference filter portion, among the plurality of Fabry-Perot interference filter portions.

In the wafer according to one aspect of the present disclosure, since each of the plurality of Fabry-Perot interference filter portions to be a Fabry-Perot interference filter is integrated, it is possible to efficiently perform faulty/non-faulty determination (inspection) for each of the Fabry-Perot interference filter portions. In addition, for example, in the Fabry-Perot interference filter portion determined as faulty as a result of the inspection, ink is applied to at least part of the above-described membrane portion. Accordingly, in a case where the membrane portion is broken, curling of the broken portion, generation of particles from the broken portion, or the like, is suppressed. Furthermore, even in a case where the membrane portion is not broken, the possibility of future breakage of the membrane portion is reduced by reinforcing the membrane portion with ink. As described above, according to the above-described wafer, it is possible to inhibit a broken Fabry-Perot interference filter from adversely affecting other Fabry-Perot interference filters while improving inspection efficiency.

Ink may penetrate into the gap formed in the faulty Fabry-Perot interference filter portion. In this case, the second mirror layer is fixed to the first mirror layer by the ink that has penetrated into the gap, making it possible to effectively suppress the curling of the broken portion of the second mirror layer, generation of particles from the broken portion, or the like. Furthermore, even in a case where the membrane portion of the Fabry-Perot interference filter portion determined as faulty is not broken, it is possible to effectively reduce the possibility of future breakage of the membrane portion by the ink penetrating the gap.

Advantageous Effects of Invention

According to the present disclosure, it is possible to provide a wafer inspection method and a wafer capable of inhibiting a broken Fabry-Perot interference filter from adversely affecting other Fabry-Perot interference filters while improving inspection efficiency.

BRIEF DESCRIPTION OF DRAWINGS

FIG. 17 is a plan view of a marked Fabry-Perot interference filter portion.

FIG. 20 is a cross-sectional view of a light detection device including a Fabry-Perot interference filter.

DESCRIPTION OF EMBODIMENTS

Figure 1:
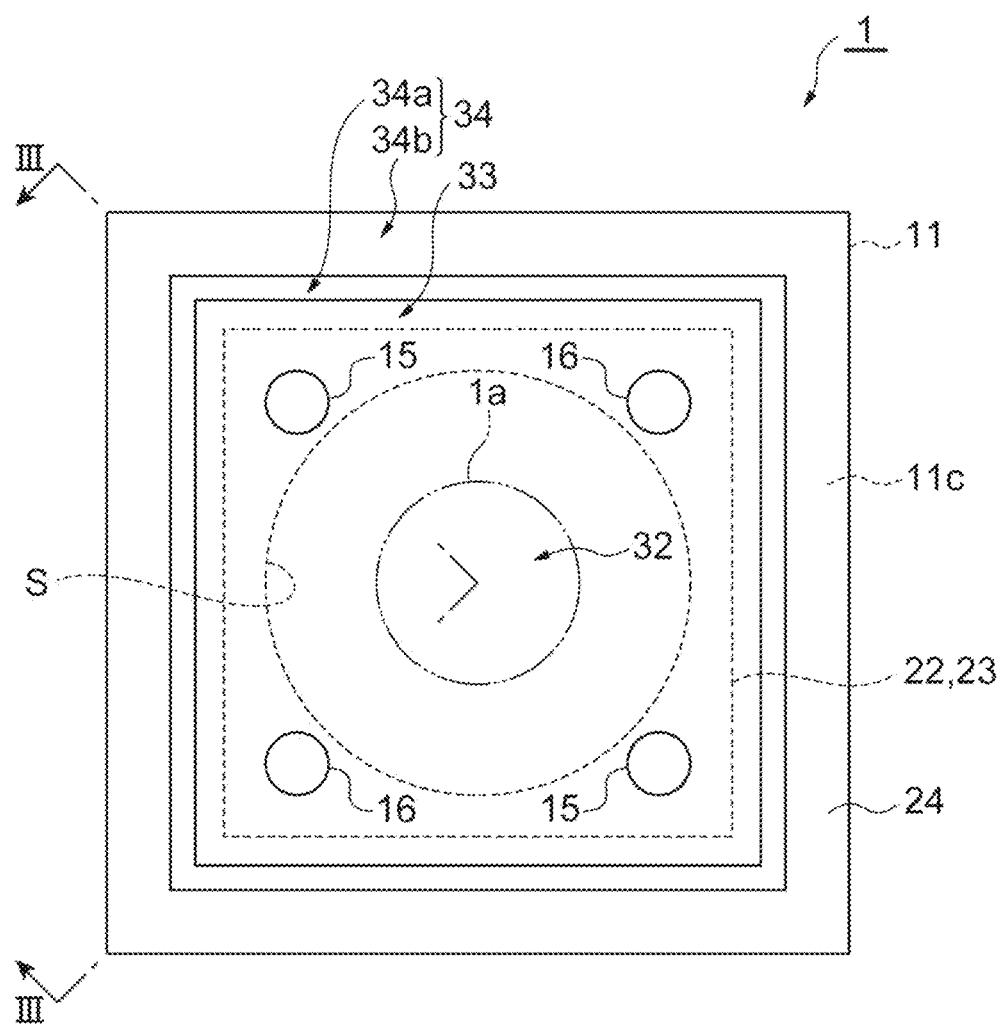
FIG. 1 is a plan view of a Fabry-Perot interference filter cut out from a wafer according to an embodiment.

Hereinafter, an embodiment of the present disclosure will be described in detail with reference to the drawings. In all the drawings, the same or equivalent portions are denoted with the same reference numerals and duplicated description is omitted.

[Configuration of Fabry-Perot Interference Filter and Dummy Filter]

Prior to the description of a configuration of a wafer and an inspection method of the wafer according to an embodiment, the configuration of each of the Fabry-Perot interference filter and the dummy filter cut out from the wafer will be described.

Figure 2:
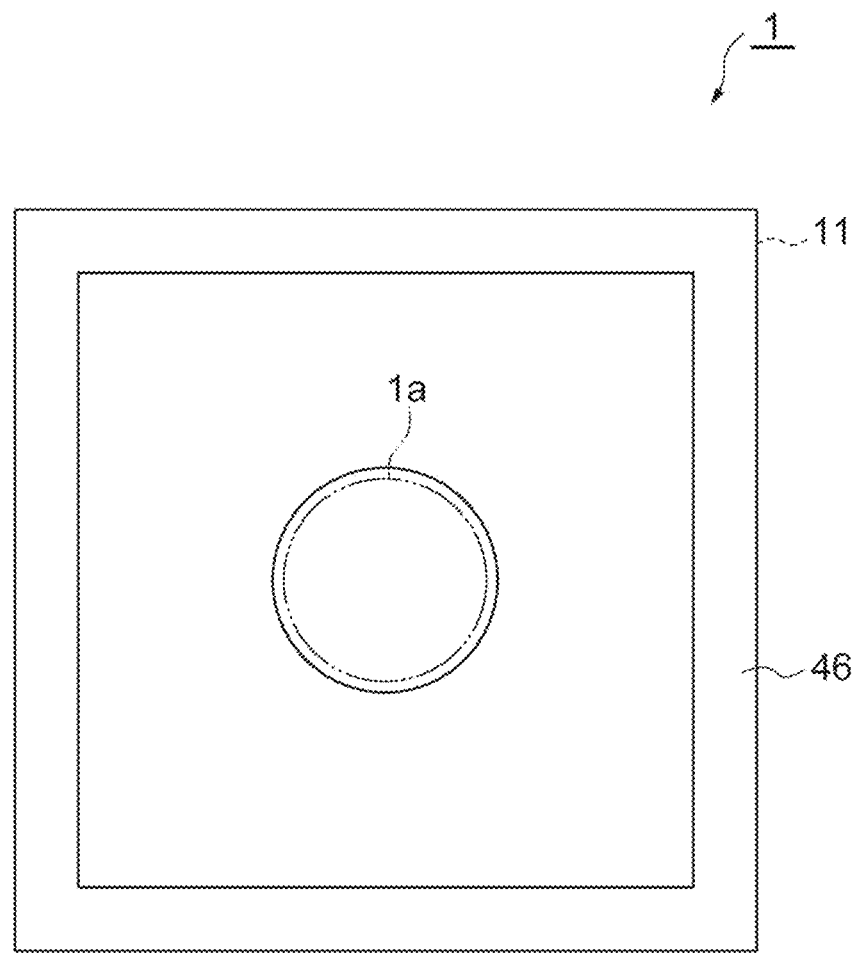
FIG. 2 is a bottom view of the Fabry-Perot interference filter illustrated in FIG. 1.
Figure 3:
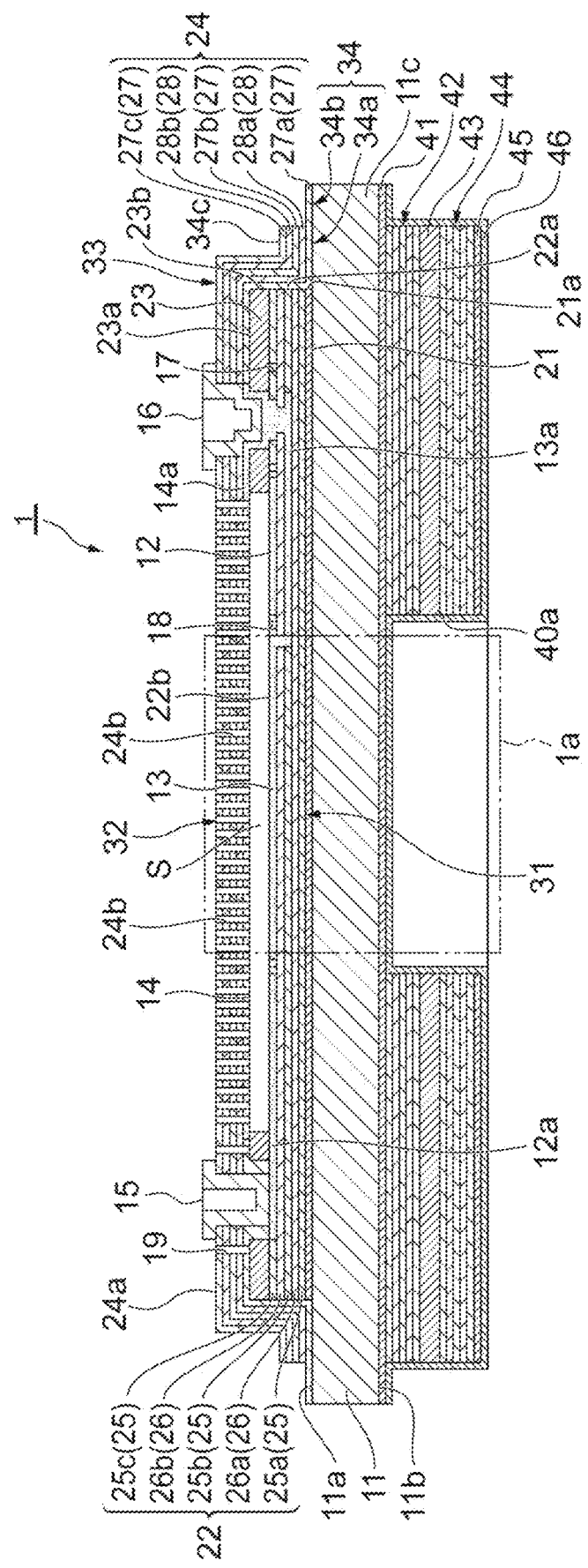
FIG. 3 is a cross-sectional view of the Fabry-Perot interference filter taken along line III-III in FIG. 1.

As illustrated in FIGS. 1, 2, and 3, a Fabry-Perot interference filter 1 includes a substrate 11. The substrate 11 has a first surface 11a and a second surface 11b opposite to the first surface 11a. On the first surface 11a, a reflection prevention layer 21, a first laminate 22, an intermediate layer 23, and a second laminate 24 are laminated in this order. A gap (air gap) S is defined between the first laminate 22 and the second laminate 24 by the frame-shaped intermediate layer 23.

The shape and the positional relationship of each of portions when viewed in a direction perpendicular to the first surface 11a (plan view) are as follows. For example, an outer edge of the substrate 11 has a rectangular shape. The outer edge of the substrate 11 and an outer edge of the second laminate 24 are aligned with each other. An outer edge of the reflection prevention layer 21, an outer edge of the first laminate 22, and an outer edge of the intermediate layer 23 are aligned with each other. The substrate 11 has an outer edge portion 11c positioned on an outer side of the outer edge of the intermediate layer 23 with respect to the center of the gap S. For example, the outer edge portion 11c has a frame shape and surrounds the intermediate layer 23 when viewed in a direction perpendicular to the first surface 11a. The gap S has a circular shape, for example.

The Fabry-Perot interference filter 1 transmits light having a predetermined wavelength through a light transmission region 1a defined in a center portion of the Fabry-Perot interference filter 1. For example, the light transmission region 1a is a columnar region. The substrate 11 is formed of silicon, quartz, or glass, for example. When the substrate 11 is formed of silicon, the reflection prevention layer 21 and the intermediate layer 23 are formed of silicon oxide, for example. The thickness of the intermediate layer 23 ranges from several tens of nm to several tens of μm, for example.

A portion corresponding to the light transmission region 1a in the first laminate 22 functions as a first mirror portion 31. The first mirror portion 31 is a fixed mirror. The first mirror portion 31 is disposed on the first surface 11a via the reflection prevention layer 21. The first laminate 22 includes alternate laminations of each of a plurality of polysilicon layers 25 and each of a plurality of silicon nitride layers 26. The Fabry-Perot interference filter 1 includes layers of a polysilicon layer 25a, a silicon nitride layer 26a, a polysilicon layer 25b, a silicon nitride layer 26b, and a polysilicon layer 25c laminated on the reflection prevention layer 21 in this order. The optical thickness of each of the polysilicon layers 25 and the silicon nitride layers 26 included in the first mirror portion 31 is preferably an integral multiple of ¼ of a center transmission wavelength. The first mirror portion 31 may be directly disposed on the first surface 11a without interposing the reflection prevention layer 21.

The portion corresponding to the light transmission region 1a in the second laminate 24 functions as a second mirror portion 32. The second mirror portion 32 is a movable mirror. The second mirror portion 32 faces the first mirror portion 31 via the gap S on a side opposite to the substrate 11 with respect to the first mirror portion 31. The direction in which the first mirror portion 31 and the second mirror portion 32 face each other is parallel to a direction perpendicular to the first surface 11a. The second laminate 24 is disposed on the first surface 11a via the reflection prevention layer 21, the first laminate 22, and the intermediate layer 23. The second laminate 24 includes alternate laminations of each of the plurality of polysilicon layers 27 and each of the plurality of silicon nitride layers 28. The Fabry-Perot interference filter 1 includes layers of a polysilicon layer 27a, a silicon nitride layer 28a, a polysilicon layer 27b, a silicon nitride layer 28b, and a polysilicon layer 27c laminated on the intermediate layer 23 in this order. The optical thickness of each of the polysilicon layer 27 and the silicon nitride layer 28 included in the second mirror portion 32 is preferably an integral multiple of ¼ of the center transmission wavelength.

In the first laminate 22 and the second laminate 24, silicon oxide layers may be used in place of the silicon nitride layers. In addition, examples of the material applicable for each of layers forming the first laminate 22 and the second laminate 24 include titanium oxide, tantalum oxide, zirconium oxide, magnesium fluoride, aluminum oxide, calcium fluoride, silicon, germanium, zinc sulfide, or the like. Here, the surface of the first mirror portion 31 on the gap S side (surface of the polysilicon layer 25c) and the surface of the second mirror portion 32 on the gap S side (surface of the polysilicon layer 27a) directly face each other via the gap S. Note that an electrode layer, a protective layer, or the like (not forming a mirror) may be formed on the surface of the first mirror portion 31 on the gap S side and on the surface of the second mirror portion 32 on the gap S side. In this case, the first mirror portion 31 and the second mirror portion 32 face each other via the gap S with the presence of these interposed layers. In other words, even in such a case, a facing configuration between the first mirror portion 31 and the second mirror portion 32 via the gap S can be achieved.

A plurality of through-holes 24b is formed at a portion of the second laminate 24 corresponding to the gap S (a portion overlapping the gap S when viewed in a direction perpendicular to the first surface 11a). Each of the through-holes 24b extends to reach the gap S from a surface 24a of the second laminate 24 opposite to the intermediate layer 23. The plurality of through-holes 24b is formed so as not to substantially influence the function of the second mirror portion 32. The plurality of through-holes 24b is used for forming the gap S by removing a portion of the intermediate layer 23 through etching.

In addition to the second mirror portion 32, the second laminate 24 further includes a covering portion 33 and a peripheral edge portion 34. The second mirror portion 32, the covering portion 33, and the peripheral edge portion 34 are integrally formed to have a portion of a same laminated structure and to be continuous to each other. The covering portion 33 surrounds the second mirror portion 32 when viewed in a direction perpendicular to the first surface 11a. The covering portion 33 covers a surface 23a of the intermediate layer 23 on a side opposite to the substrate 11, a side surface 23b of the intermediate layer 23 (a side surface on the outer side, that is, a side surface on a side opposite to the gap S side), a side surface 22a of the first laminate 22, and a side surface 21a of the reflection prevention layer 21, so as to reach the first surface 11a. That is, the covering portion 33 covers the outer edge of the intermediate layer 23, the outer edge of the first laminate 22, and the outer edge of the reflection prevention layer 21.

The peripheral edge portion 34 surrounds the covering portion 33 when viewed in a direction perpendicular to the first surface 11a. The peripheral edge portion 34 is positioned on the first surface 11a in the outer edge portion 11c. The outer edge of the peripheral edge portion 34 is aligned with the outer edge of the substrate 11 when viewed in a direction perpendicular to the first surface 11a. The peripheral edge portion 34 is thinned along an outer edge of the outer edge portion 11c. That is, the portion along the outer edge of the outer edge portion 11c in the peripheral edge portion 34 is thinner compared to other portions excluding the portion along the outer edge of the peripheral edge portion 34. In the Fabry-Perot interference filter 1, the peripheral edge portion 34 is thinned by removing a portion of the polysilicon layer 27 and the silicon nitride layer 28 included in the second laminate 24. The peripheral edge portion 34 includes a non-thinned portion 34a continuous to the covering portion 33, and a thinned portion 34b surrounding the non-thinned portion 34a. In the thinned portion 34b, the polysilicon layer 27 and the silicon nitride layer 28 are removed excluding the polysilicon layer 27a directly provided on the first surface 11a.

The height from the first surface 11a to a surface 34c of the non-thinned portion 34a on a side opposite to the substrate 11 is lower than the height from the first surface 11a to the surface 23a of the intermediate layer 23. The height from the first surface 11a to the surface 34c of the non-thinned portion 34a ranges from 100 nm to 5000 nm, for example. The height from the first surface 11a to the surface 23a of the intermediate layer 23 ranges from 500 nm to 20000 nm, for example. The width of the thinned portion 34b (distance between the outer edge of the non-thinned portion 34a and the outer edge of the outer edge portion 11c when viewed in the direction perpendicular to the first surface 11a) is 0.01 times the thickness of the substrate 11, or more. The width of the thinned portion 34b ranges from 5 μm to 400 μm, for example. The thickness of the substrate 11 ranges from 500 μm to 800 μm, for example.

A first electrode 12 is formed in the first mirror portion 31 so as to surround the light transmission region 1a when viewed in a direction perpendicular to the first surface 11a. The first electrode 12 is formed by doping impurities into the polysilicon layer 25c to achieve low resistivity. A second electrode 13 is formed in the first mirror portion 31 so as to include the light transmission region 1a when viewed in a direction perpendicular to the first surface 11a. The second electrode 13 is formed by doping impurities into the polysilicon layer 25c to achieve low resistivity. Note that although it is preferable that the second electrode 13 is sized to include the entire light transmission region 1a when viewed in a direction perpendicular to the first surface 11a, the second electrode 13 may have substantially the same size as that of the light transmission region 1a.

A third electrode 14 is formed in the second mirror portion 32. The third electrode 14 faces the first electrode 12 and the second electrode 13 via the gap S. The third electrode 14 is formed by doping impurities into the polysilicon layer 27a to achieve low resistivity.

A pair of terminals 15 are provided to face each other with the light transmission region 1a interposed between them. Each of the terminals 15 is disposed inside a through-hole leading from the surface 24a of the second laminate 24 to the first laminate 22. Each of the terminals 15 is electrically connected to the first electrode 12 through wiring 12a. For example, each of the terminals 15 is formed with a metal film of aluminum, an alloy thereof, or the like.

A pair of terminals 16 are provided to face each other with the light transmission region 1a interposed between them. Each of the terminals 16 is disposed inside a through-hole leading from the surface 24a of the second laminate 24 to the first laminate 22. Each of the terminals 16 is electrically connected to the second electrode 13 through wiring 13a and is electrically connected to the third electrode 14 through wiring 14a. For example, the terminals 16 are formed with a metal film of aluminum, an alloy thereof, or the like. The facing direction of the pair of terminals 15 and the facing direction of the pair of terminals 16 are orthogonal to each other (refer to FIG. 1).

A plurality of trenches 17 and 18 is provided on a surface 22b of the first laminate 22. The trench 17 annularly extends to surround a connection with respect to the terminals 16 in the wiring 13a. The trench 17 electrically insulates the first electrode 12 and the wiring 13a from each other. The trench 18 annularly extends along an inner edge of the first electrode 12. The trench 18 electrically insulates the first electrode 12 and a region of the first electrode 12 on an inner side (second electrode 13) from each other. Each of the regions within the trenches 17 and 18 may be an insulating material or a gap.

A trench 19 is provided on the surface 24a of the second laminate 24. The trench 19 annularly extends to surround the terminals 15. The trench 19 electrically insulates the terminals 15 and the third electrode 14 from each other. The region inside the trench 19 may be an insulating material or a gap.

The second surface 11b of the substrate 11 includes layers of a reflection prevention layer 41, a third laminate 42, an intermediate layer 43, and a fourth laminate 44 laminated in this order. The reflection prevention layer 41 and the intermediate layer 43 each have a configuration similar to those of the reflection prevention layer 21 and the intermediate layer 23. The third laminate 42 and the fourth laminate 44 each have a laminated structure symmetrical to those of the first laminate 22 and the second laminate 24 with respect to the substrate 11. The reflection prevention layer 41, the third laminate 42, the intermediate layer 43, and the fourth laminate 44 have a function of suppressing warpage of the substrate 11.

The third laminate 42, the intermediate layer 43, and the fourth laminate 44 are thinned along the outer edge of the outer edge portion 11c. That is, the portion along the outer edge of the outer edge portion 11c in the third laminate 42, the intermediate layer 43, and the fourth laminate 44 is thinner compared to other portions excluding the portion along the outer edge in the third laminate 42, the intermediate layer 43, and the fourth laminate 44. In the Fabry-Perot interference filter 1, the third laminate 42, the intermediate layer 43, and the fourth laminate 44 are thinned by removing all of the third laminate 42, the intermediate layer 43, and the fourth laminate 44 in a portion overlapping the thinned portion 34b when viewed in a direction perpendicular to the first surface 11a.

The third laminate 42, the intermediate layer 43, and the fourth laminate 44 have an opening 40a so as to include the light transmission region 1a when viewed in a direction perpendicular to the first surface 11a. The opening 40a has a diameter approximately the same as the size of the light transmission region 1a. The opening 40a is open on the light emission side. The bottom surface of the opening 40a reaches the reflection prevention layer 41.

A light shielding layer 45 is formed on a surface of the fourth laminate 44 on the light emission side. For example, the light shielding layer 45 is formed of aluminum or the like. A protective layer 46 is formed on a surface of the light shielding layer 45 and an inner surface of the opening 40a. The protective layer 46 covers the outer edges of the third laminate 42, the intermediate layer 43, the fourth laminate 44, and the light shielding layer 45 and covers the reflection prevention layer 41 on the outer edge portion 11c. For example, the protective layer 46 is formed of aluminum oxide. An optical influence due to the protective layer 46 can be disregarded by causing the thickness of the protective layer 46 to range from 1 nm to 100 nm (preferably, approximately 30 nm).

In the Fabry-Perot interference filter 1 configured as described above, when a voltage is applied between the first electrode 12 and the third electrode 14 via the pair of terminals 15 and 16, an electrostatic force corresponding to the voltage is generated between the first electrode 12 and the third electrode 14. The second mirror portion 32 is attracted to the first mirror portion 31 side secured to the substrate 11 by the electrostatic force, and the distance between the first mirror portion 31 and the second mirror portion 32 is adjusted. In this manner, in the Fabry-Perot interference filter 1, the distance between the first mirror portion 31 and the second mirror portion 32 changes by the electrostatic force.

The wavelength of light to be transmitted through the Fabry-Perot interference filter 1 depends on the distance between the first mirror portion 31 and the second mirror portion 32 in the light transmission region 1a. Therefore, the wavelength of light to be transmitted through the Fabry-Perot interference filter 1 can be appropriately selected by adjusting the voltage to be applied between the first electrode 12 and the third electrode 14. At this time, the second electrode 13 has the same potential as that of the third electrode 14. Therefore, the second electrode 13 functions as a compensation electrode to keep the first mirror portion 31 and the second mirror portion 32 flat in the light transmission region 1a.

In the Fabry-Perot interference filter 1, for example, a spectroscopic spectrum can be obtained by detecting light transmitted through the light transmission region 1a of the Fabry-Perot interference filter 1 using a light detector while changing the voltage to be applied to the Fabry-Perot interference filter 1 (that is, while changing the distance between the first mirror portion 31 and the second mirror portion 32 in the Fabry-Perot interference filter 1).

Figure 4:
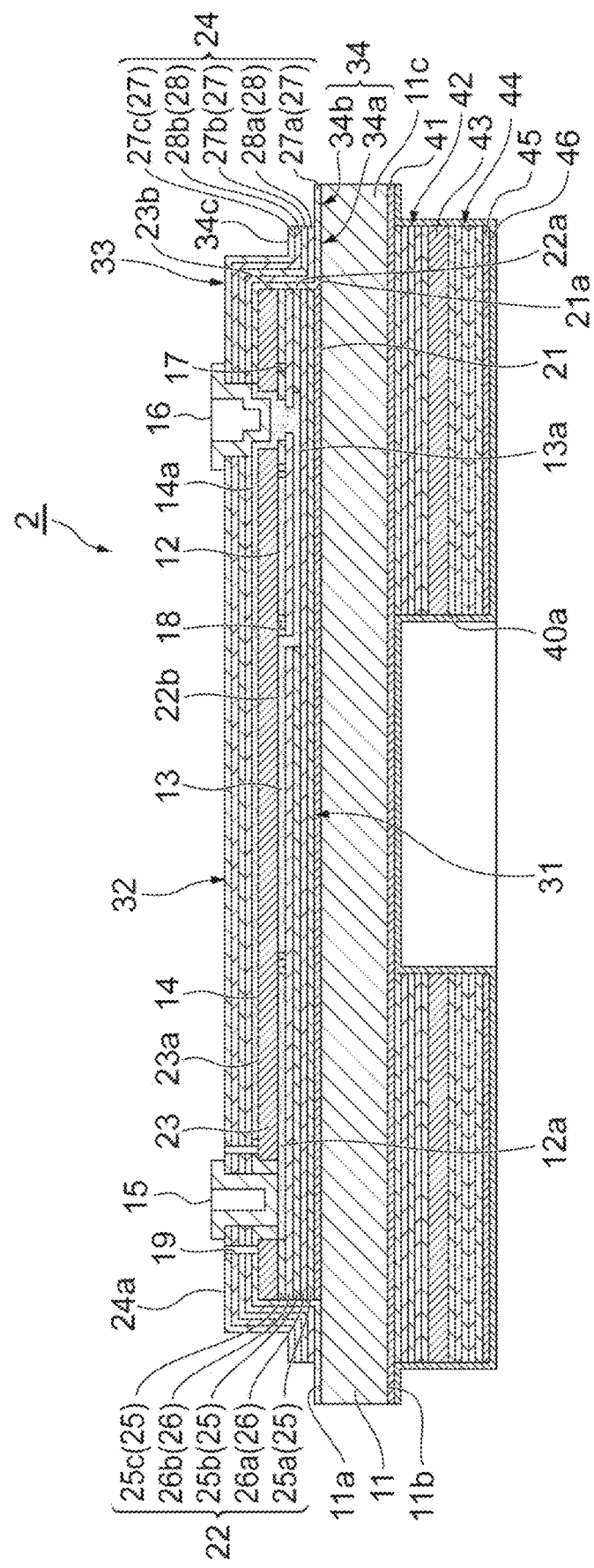
FIG. 4 is a cross-sectional view of a dummy filter cut out from a wafer according to one embodiment.

As illustrated in FIG. 4, the dummy filter 2 is different from the Fabry-Perot interference filter 1 described above in that the plurality of through-holes 24b is not formed in the second laminate 24 and the gap S is not formed in the intermediate layer 23. In the dummy filter 2, an intermediate layer 23 is provided between the first mirror portion 31 and the second mirror portion 32. That is, the second mirror portion 32 is disposed on the surface 23a of the intermediate layer 23, not floating above the gap S.

[Wafer Configuration]

Figure 5:
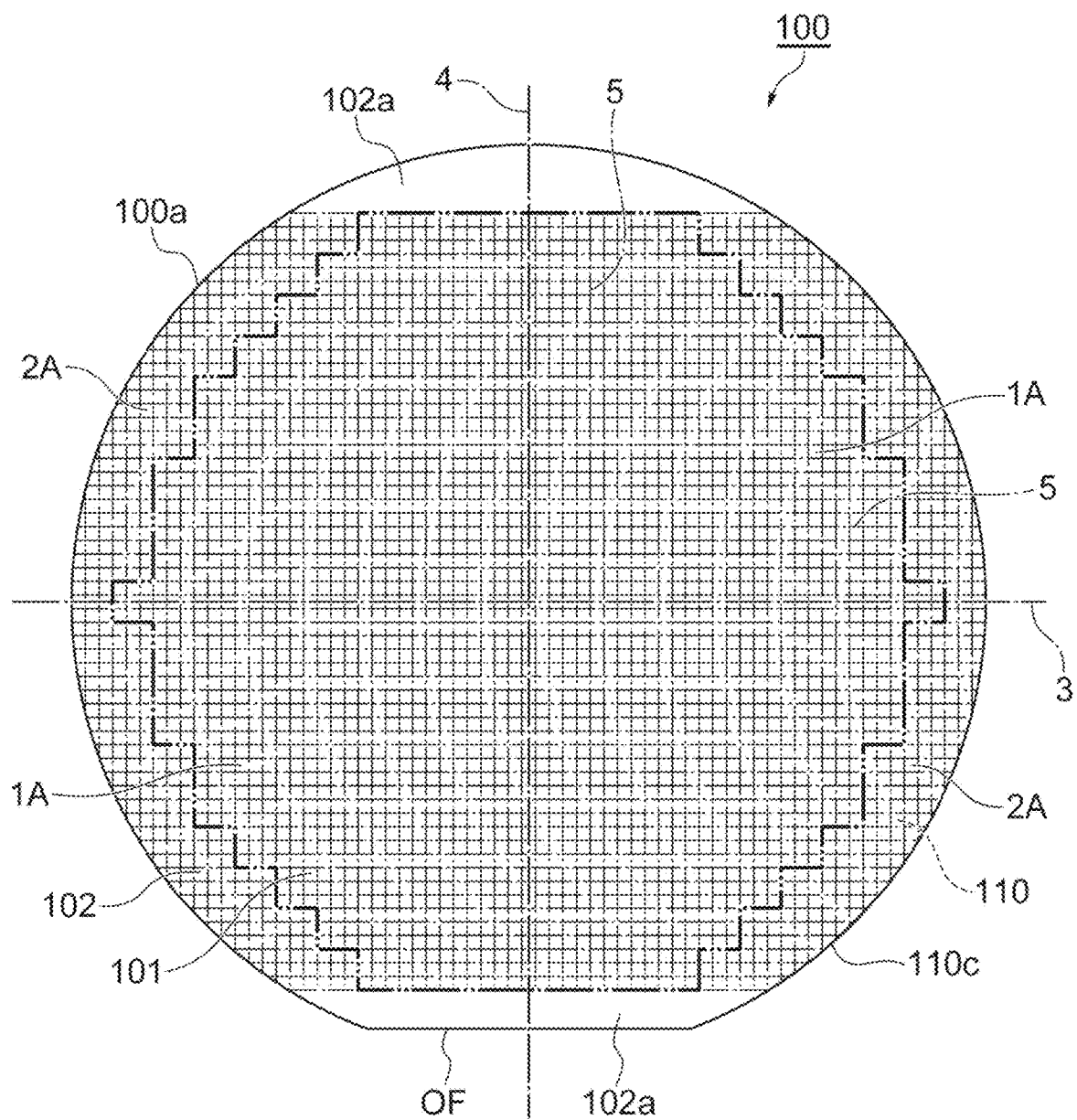
FIG. 5 is a plan view of a wafer according to one embodiment.
Figure 6:
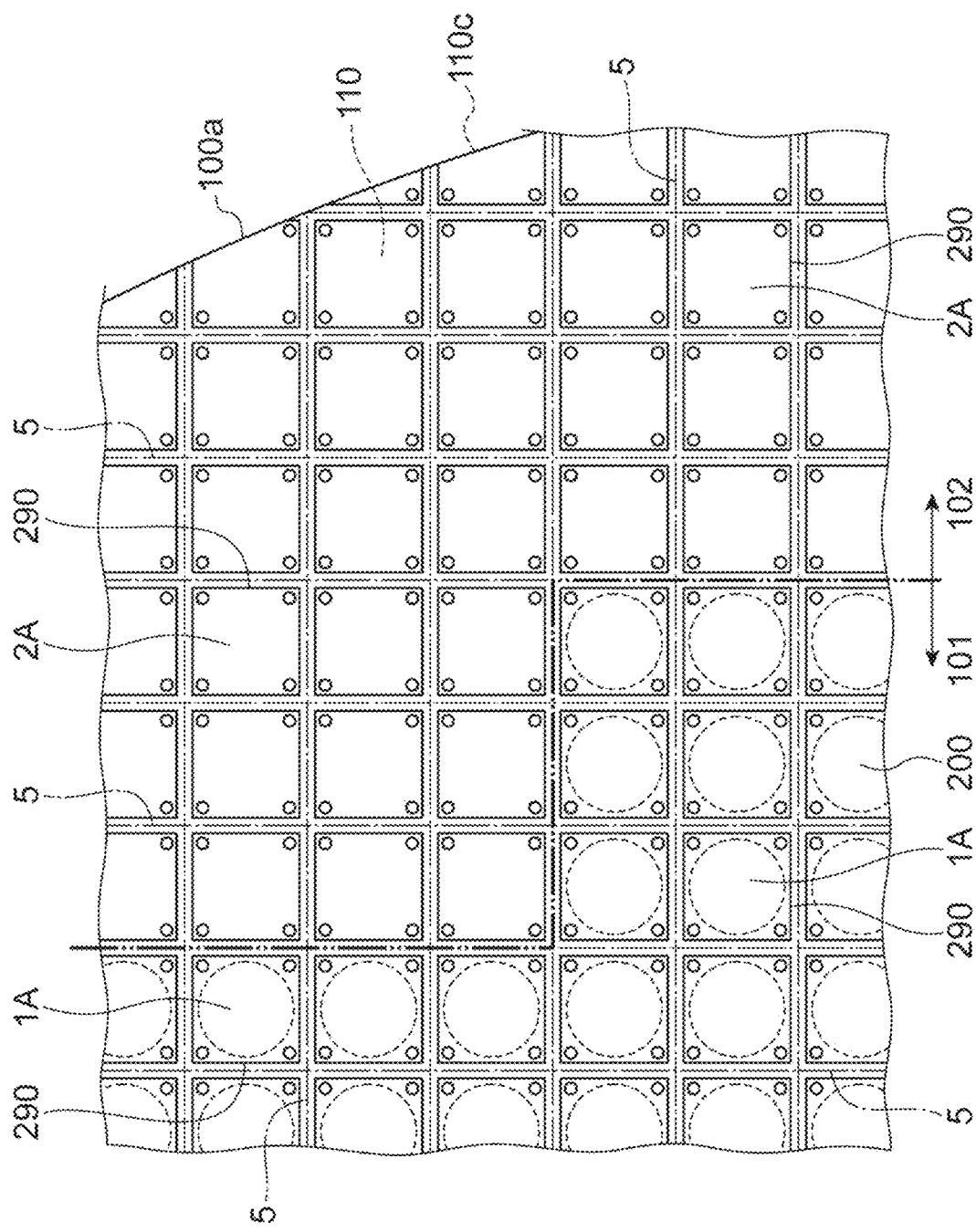
FIG. 6 is an enlarged plan view of a portion of the wafer illustrated in FIG. 5.

Next, a configuration of a wafer according to an embodiment will be described. As illustrated in FIGS. 5 and 6, a wafer 100 includes a substrate layer 110. The substrate layer 110 has a disk shape for example, with an orientation flat OF formed in a portion of the substrate layer 110. For example, the substrate layer 110 is formed of silicon, quartz, glass, or the like. Hereinafter, a virtual straight line that passes through the center of the substrate layer 110 when viewed in the thickness direction of the substrate layer 110 and is parallel to the orientation flat OF is referred to as a first straight line 3, while a virtual straight line that passes through the center of the substrate layer 110 when viewed in the thickness direction of the substrate layer 110 and is perpendicular to the orientation flat OF is referred to as a second straight line 4.

The wafer 100 includes an effective area 101 and a dummy area 102. The dummy area 102 is an area along an outer edge 110c of the substrate layer 110 (that is, the outer edge 100a of the wafer 100). The effective area 101 is an area inside the dummy area 102. The dummy area 102 surrounds the effective area 101 when viewed in the thickness direction of the substrate layer 110. The dummy area 102 is adjacent to the effective area 101.

The effective area 101 includes a plurality of two-dimensionally arranged Fabry-Perot interference filter portions 1A. The plurality of Fabry-Perot interference filter portions 1A is provided in the entire effective area 101. The dummy area 102 includes a plurality of two-dimensionally arranged dummy filter portions 2A. The plurality of dummy filter portions 2A is provided in an area of the dummy area 102 excluding a pair of areas 102a. One area 102a is an area along the orientation flat OF. The other area 102a is an area along the portion of the outer edge 110c of the substrate layer 110 on the side opposite to the orientation flat OF. The Fabry-Perot interference filter portion 1A and the dummy filter portion 2A are adjacent to each other at a boundary between the effective area 101 and the dummy area 102. When viewed in the thickness direction of the substrate layer 110, the outer shape of the Fabry-Perot interference filter portion 1A and the outer shape of the dummy filter portion 2A are the same. The plurality of Fabry-Perot interference filter portions 1A and the plurality of dummy filter portions 2A are arranged so as to be symmetric about each of the first straight line 3 and the second straight line 4 orthogonal to each other. The plurality of dummy filter portions 2A may be provided over the entire dummy area 102. Furthermore, the plurality of dummy filter portions 2A may be provided in an area other than one of the areas 102a in the dummy areas 102.

Each of the plurality of Fabry-Perot interference filter portions 1A is to be each of a plurality of Fabry-Perot interference filters 1 when the wafer 100 is cut along each of lines 5. Each of the plurality of dummy filter portions 2A is to be each of a plurality of dummy filters 2 when the wafer 100 is cut along each of the lines 5. When viewed in the thickness direction of the substrate layer 110, the plurality of lines 5 extends in a direction parallel to the orientation flat OF, and the plurality of lines 5 extends in a direction perpendicular to the orientation flat OF. As an example, when each of the filter portions 1A and 2A has a rectangular shape when viewed in the thickness direction of the substrate layer 110, each of the filter portions 1A and 2A is arranged in a two-dimensional matrix, and the plurality of lines 5 is set in a lattice pattern so as to pass between adjacent filter portions 1A-1A, between adjacent filter portions 1A-2A, and between adjacent filter portions 2A-2A.

Figure 7:
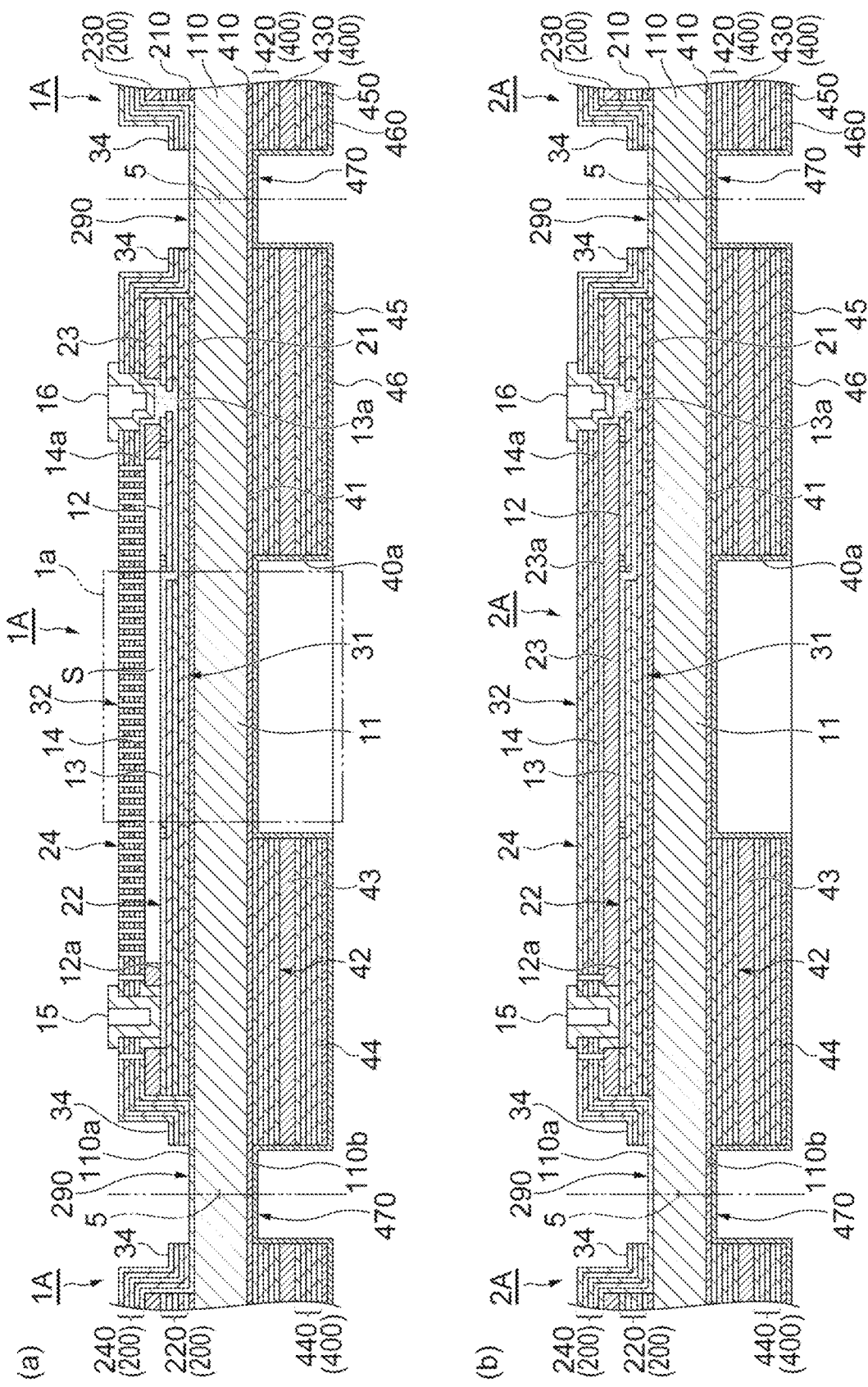
FIG. 7 is a cross-sectional view of a Fabry-Perot interference filter portion and a dummy filter portion of the wafer illustrated in FIG. 5.

(a) of FIG. 7 is a cross-sectional view of the Fabry-Perot interference filter portion 1A. (b) of FIG. 7 is a cross-sectional view of the dummy filter portion 2A. As illustrated in (a) and (b) of FIG. 7, the substrate layer 110 is a layer that is to be a plurality of substrates 11 when the wafer 100 is cut along each of the lines 5. The substrate layer 110 has a first surface 110a and a second surface 110b opposite to the first surface 110a. A reflection prevention layer 210 is provided on the first surface 110a of the substrate layer 110. The reflection prevention layer 210 is a layer to be a plurality of reflection prevention layers 21 when the wafer 100 is cut along each of the lines 5. A reflection prevention layer 410 is provided on the second surface 110b of the substrate layer 110. The reflection prevention layer 410 is a layer to be a plurality of reflection prevention layers 41 when the wafer 100 is cut along each of the lines 5.

A device layer 200 is provided on the reflection prevention layer 210. The device layer 200 includes a first mirror layer 220, an intermediate layer 230, and a second mirror layer 240. The first mirror layer 220 is a layer having a plurality of first mirror portions 31, and is a layer to be a plurality of first laminates 22 when the wafer 100 is cut along each of the lines 5. The plurality of first mirror portions 31 is two-dimensionally arranged on the first surface 110a of the substrate layer 110 via the reflection prevention layer 210. The intermediate layer 230 is a layer to be a plurality of intermediate layers 23 when the wafer 100 is cut along each of the lines 5. The second mirror layer 240 is a layer having a plurality of second mirror portions 32, and is a layer to be a plurality of second laminates 24 when the wafer 100 is cut along each of the lines 5. The plurality of second mirror portions 32 is two-dimensionally arranged on the first mirror layer 220 via the intermediate layer 23.

A stress adjustment layer 400 is provided on the reflection prevention layer 410. That is, the stress adjustment layer 400 is provided on the second surface 110b of the substrate layer 110 via the reflection prevention layer 410. The stress adjustment layer 400 includes a plurality of layers 420, 430, and 440. The layer 420 is a layer that is to be a plurality of third laminates 42 when the wafer 100 is cut along each of the lines 5. The layer 430 is a layer to be a plurality of intermediate layers 43 when the wafer 100 is cut along each of the lines 5. The layer 440 is a layer to be a plurality of fourth laminates 44 when the wafer 100 is cut along each of the lines 5.

A light shielding layer 450 and a protective layer 460 are provided on the stress adjustment layer 400. The light shielding layer 450 is a layer that is to be a plurality of light shielding layers 45 when the wafer 100 is cut along each of the lines 5. The protective layer 460 is a layer that is to be a plurality of protective layers 46 when the wafer 100 is cut along each of the lines 5.

As illustrated in (a) of FIG. 7, each of the Fabry-Perot interference filter portions 1A has a gap S formed between a portion of the first mirror layer 220 at least including the first mirror portion 31 and a portion of the second mirror layer 240 at least including the second mirror portion 32 facing each other. That is, in each of the Fabry-Perot interference filter portions 1A, the intermediate layer 23 defines the gap S, and the second mirror portion 32 floats on the gap S. As illustrated in FIG. 1, in the present embodiment, the gap S is formed in a circular region slightly larger than the light transmission region 1a when viewed in a direction in which the first mirror portion 31 and the second mirror portion 32 face each other (hereinafter, simply referred to as "facing direction"). Similarly to the configuration of the Fabry-Perot interference filter 1 described above, each of the Fabry-Perot interference filter portions 1A includes a configuration related to the first electrode 12, the second electrode 13, the third electrode 14, the plurality of terminals 15 and 16, the opening 40a, and the like. Therefore, even when the plurality of Fabry-Perot interference filter portions 1A is still in the state of the wafer 100, applying a voltage to each of the Fabry-Perot interference filter portions 1A via the pair of terminals 15 and 16 would change the distance between the first mirror portion 31 and the second mirror portion 32 facing each other by the electrostatic force.

As illustrated in (b) of FIG. 7, each of the dummy filter portions 2A includes the intermediate layer 23 provided between the first mirror portion 31 and the second mirror portion 32 facing each other. That is, in the dummy filter portion 2A, the intermediate layer 23 does not define the gap S, and the second mirror portion 32 is disposed on the surface 23a of the intermediate layer 23. Accordingly, although each of the dummy filter portions 2A has a configuration related to the first electrode 12, the second electrode 13, the third electrode 14, the plurality of terminals 15 and 16, the openings 40a, and the like, similarly to the configuration of the dummy filter 2 described above, the distance between the first mirror portion 31 and the second mirror portion 32 facing each other would not change. Note that each of the dummy filter portions 2A does not need to include the configuration related to the first electrode 12, the second electrode 13, the third electrode 14, the plurality of terminals 15 and 16 (a metal film such as aluminum to form each of the terminals 15 and 16, through-holes for disposing each of the terminals 15 and 16, and the like), the opening 40a, and the like.

As illustrated in FIG. 6 and (a) of FIG. 7, the device layer 200 has a first groove 290 opening on the side opposite to the substrate layer 110. The first groove 290 is formed along each of the lines 5. The first groove 290 surrounds the first mirror portion 31, the intermediate layer 23, and the second mirror portion 32 in each of the Fabry-Perot interference filter portions 1A and each of the dummy filter portions 2A. In each of the Fabry-Perot interference filter portions 1A, the first mirror portion 31, the intermediate layer 23, and the second mirror portion 32 are surrounded by the annularly continuous first groove 290. Similarly, in each of the dummy filter portions 2A, the first mirror portion 31, the intermediate layer 23, and the second mirror portion 32 are surrounded by the annularly continuous first groove 290. Focusing on the adjacent filter portions 1A-1A, the adjacent filter portions 1A-2A, and the adjacent filter portions 2A-2A, the first groove 290 corresponds to a region on a peripheral edge portion 34 of one filter portion and a peripheral edge portion 34 of the other filter portion. The first groove 290 is continuous in the effective area 101 and the dummy area 102 and reaches the outer edge 110c of the substrate layer 110 when viewed in the facing direction. It is sufficient as long as the first groove 290 surrounds at least the second mirror portion 32 in each of the Fabry-Perot interference filter portions 1A and each of the dummy filter portions 2A.

As illustrated in (b) of FIG. 7, the stress adjustment layer 400 has a second groove 470 opening on the side opposite to the substrate layer 110. The second groove 470 is formed along each of the lines 5. That is, the second groove 470 is formed so as to correspond to the first groove 290. Here, formation of the second groove 470 corresponding to the first groove 290 means that the second groove 470 overlaps the first groove 290 when viewed in the facing direction. Therefore, the second groove 470 is continuous in the effective area 101 and the dummy area 102 and reaches the outer edge 110c of the substrate layer 110 when viewed in the facing direction.

[Method of Manufacturing Wafer]

Next, a method of manufacturing the wafer 100 will be described with reference to FIGS. 8 to 13. In FIGS. 8 to 13, (a) is cross-sectional view of a portion corresponding to the Fabry-Perot interference filter portion 1A, and (b) is a cross-sectional view of a portion corresponding to the dummy filter portion 2A.

Figure 8:
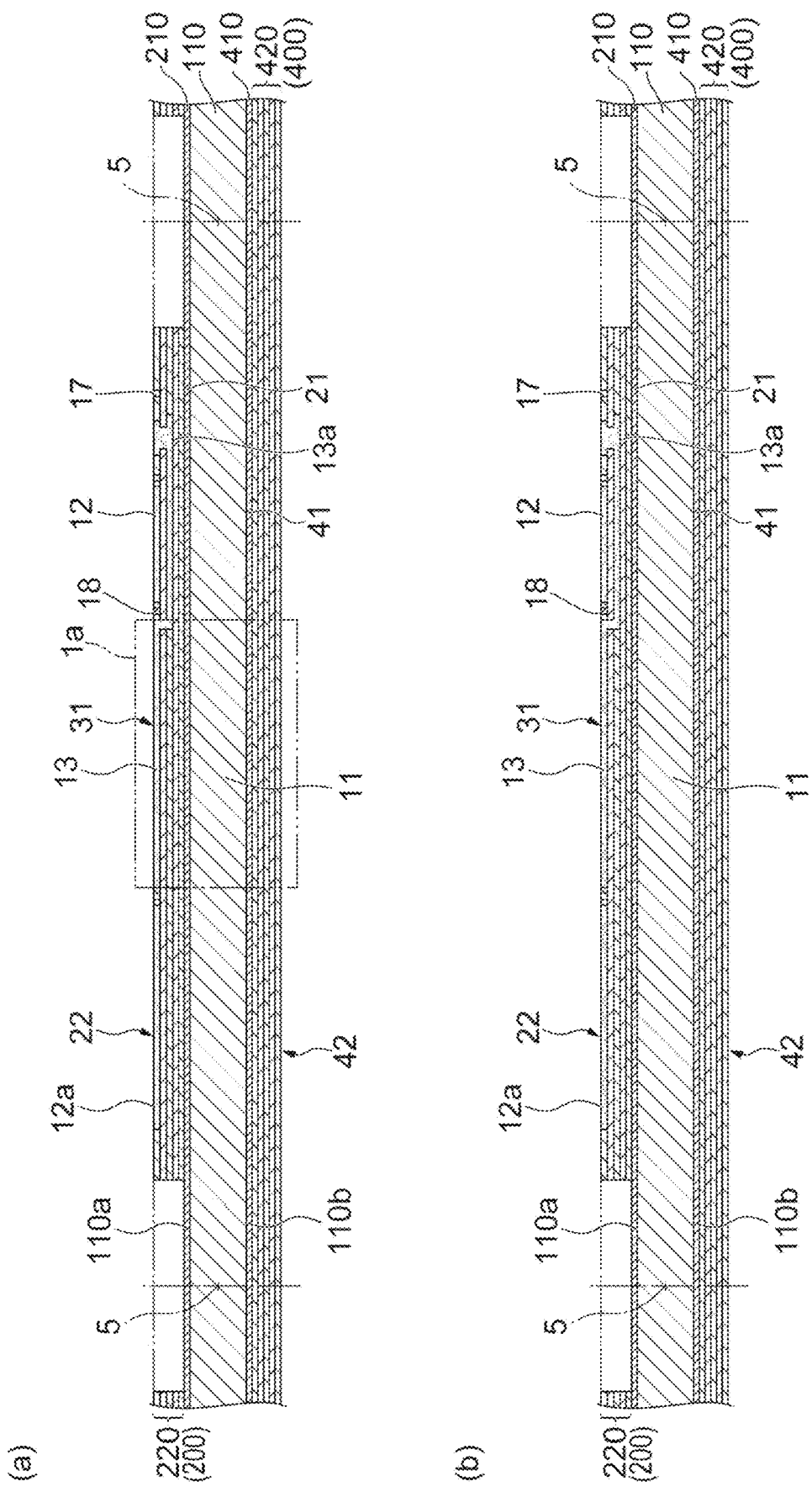
FIG. 8 is a cross-sectional view illustrating a method for manufacturing the wafer illustrated in FIG. 5.

First, as illustrated in FIG. 8, the reflection prevention layer 210 is formed on the first surface 110a of the substrate layer 110 together with formation of the reflection prevention layer 410 on the second surface 110b of the substrate layer 110. Subsequently, a plurality of polysilicon layers and a plurality of silicon nitride layers are alternately laminated on each of the reflection prevention layers 210 and 410, so as to form the first mirror layer 220 on the reflection prevention layer 210 and form the layer 420 on the reflection prevention layer 410.

When the first mirror layer 220 is formed, etching is performed to remove a portion along each of the lines 5 in the first mirror layer 220 so as to expose the surface of the reflection prevention layer 210. In addition, by doping impurities to achieve low resistivity in a portion of a predetermined polysilicon layer in the first mirror layer 220, the first electrode 12, the second electrode 13, and the wiring 12a and 13a are formed in each of portions corresponding to the substrate 11. Moreover, etching is performed to form the trenches 17 and 18 on a surface of the first mirror layer 220 in each of portions corresponding to the substrate 11.

Figure 9:
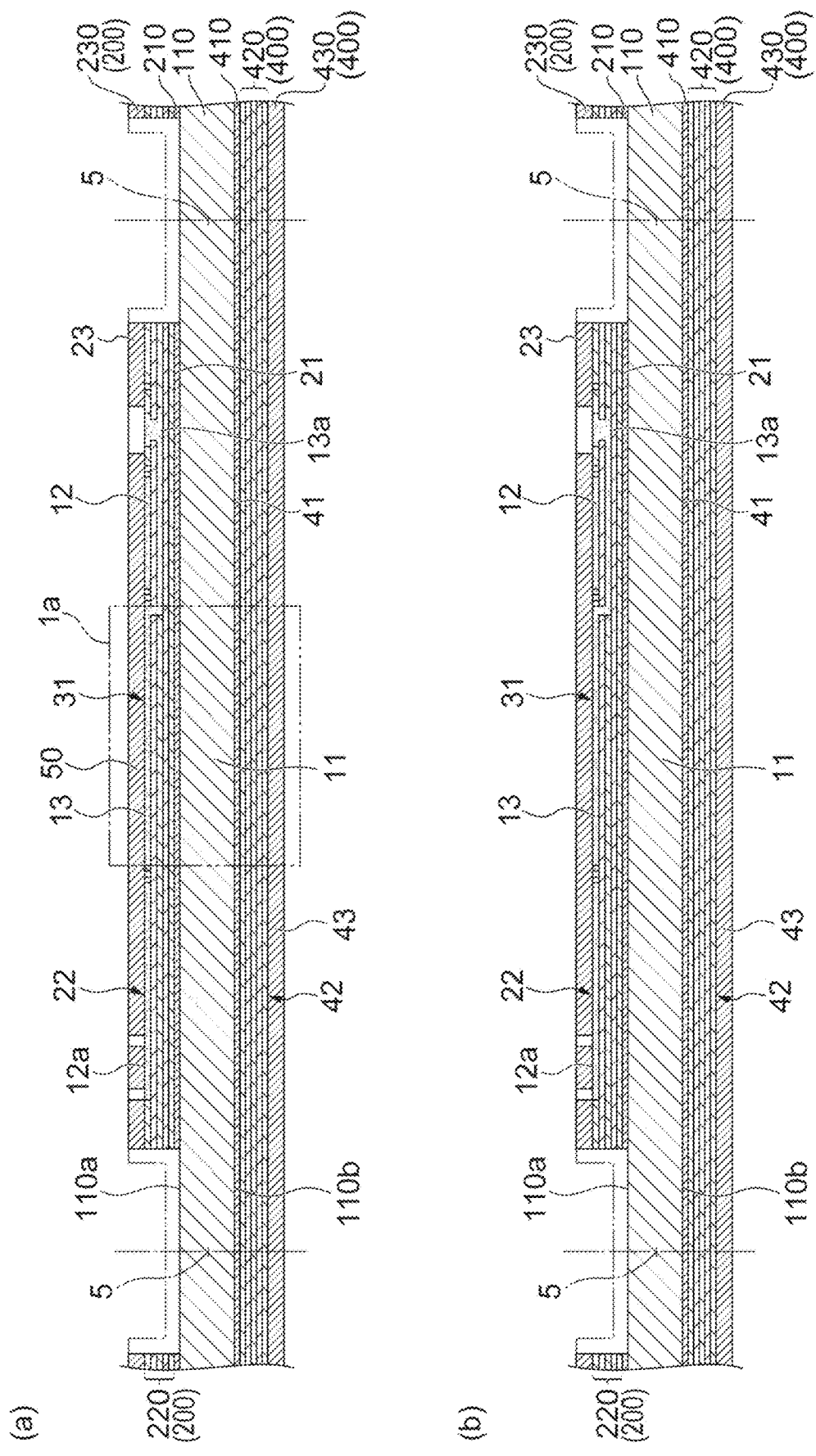
FIG. 9 is a cross-sectional view illustrating a method for manufacturing the wafer illustrated in FIG. 5.

Subsequently, as illustrated in FIG. 9, the intermediate layer 230 is formed on the first mirror layer 220 and on the exposed surface of the reflection prevention layer 210, and the layer 430 is formed on the layer 420. At a portion corresponding to each of the Fabry-Perot interference filter portions 1A, the intermediate layer 230 includes a portion 50 expected to be removed corresponding to the gap S (refer to FIG. 3). Subsequently, etching is performed to remove a portion along each of the lines 5 in the intermediate layer 230 and the reflection prevention layer 210 so as to expose the first surface 110a of the substrate layer 110. In addition, the etching is performed to form a gap at a portion corresponding to each of the terminals 15 and 16 (refer to FIG. 3) in the intermediate layer 230 for each of portions corresponding to the substrate 11.

Figure 10:
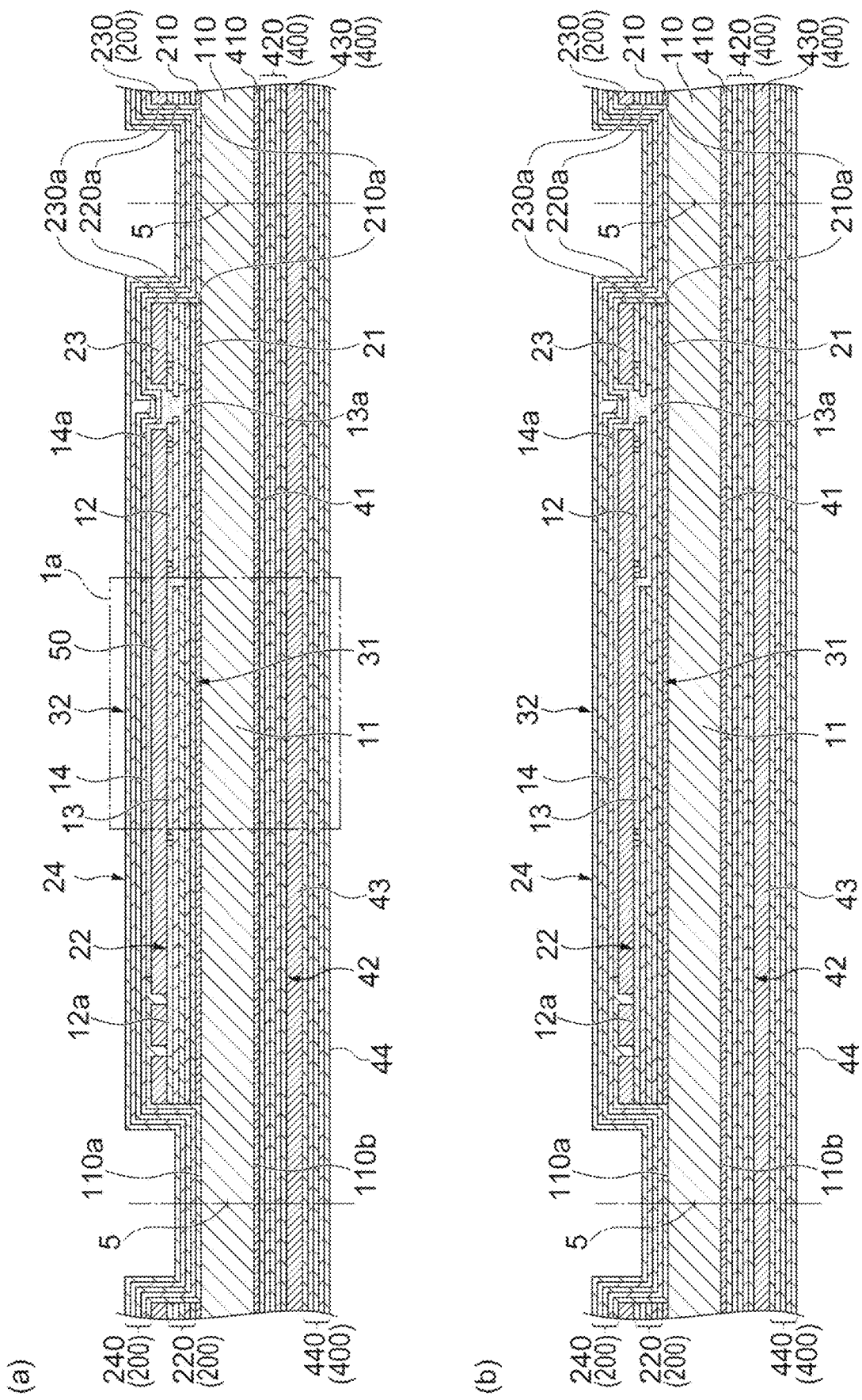
FIG. 10 is a cross-sectional view illustrating a method for manufacturing the wafer illustrated in FIG. 5.

Subsequently, as illustrated in FIG. 10, a plurality of polysilicon layers and a plurality of silicon nitride layers are alternately laminated on each of the first surface 110a side and the second surface 110b side of the substrate layer 110, thereby forming the second mirror layer 240 on the intermediate layer 230 and on the exposed first surface 110a of the substrate layer 110, as well as forming the layer 440 on the layer 430.

When the second mirror layer 240 is formed, side surfaces 230a of the intermediate layer 230, side surfaces 220a of the first mirror layer 220, and side surfaces 210a of the reflection prevention layer 210, facing each other along the line 5, are covered with the second mirror layer 240. In addition, by doping impurities to achieve low resistivity in a portion of a predetermined polysilicon layer in the second mirror layer 240, the third electrode 14 and the wiring 14a are formed in each of portions corresponding to the substrate 11.

Figure 11:
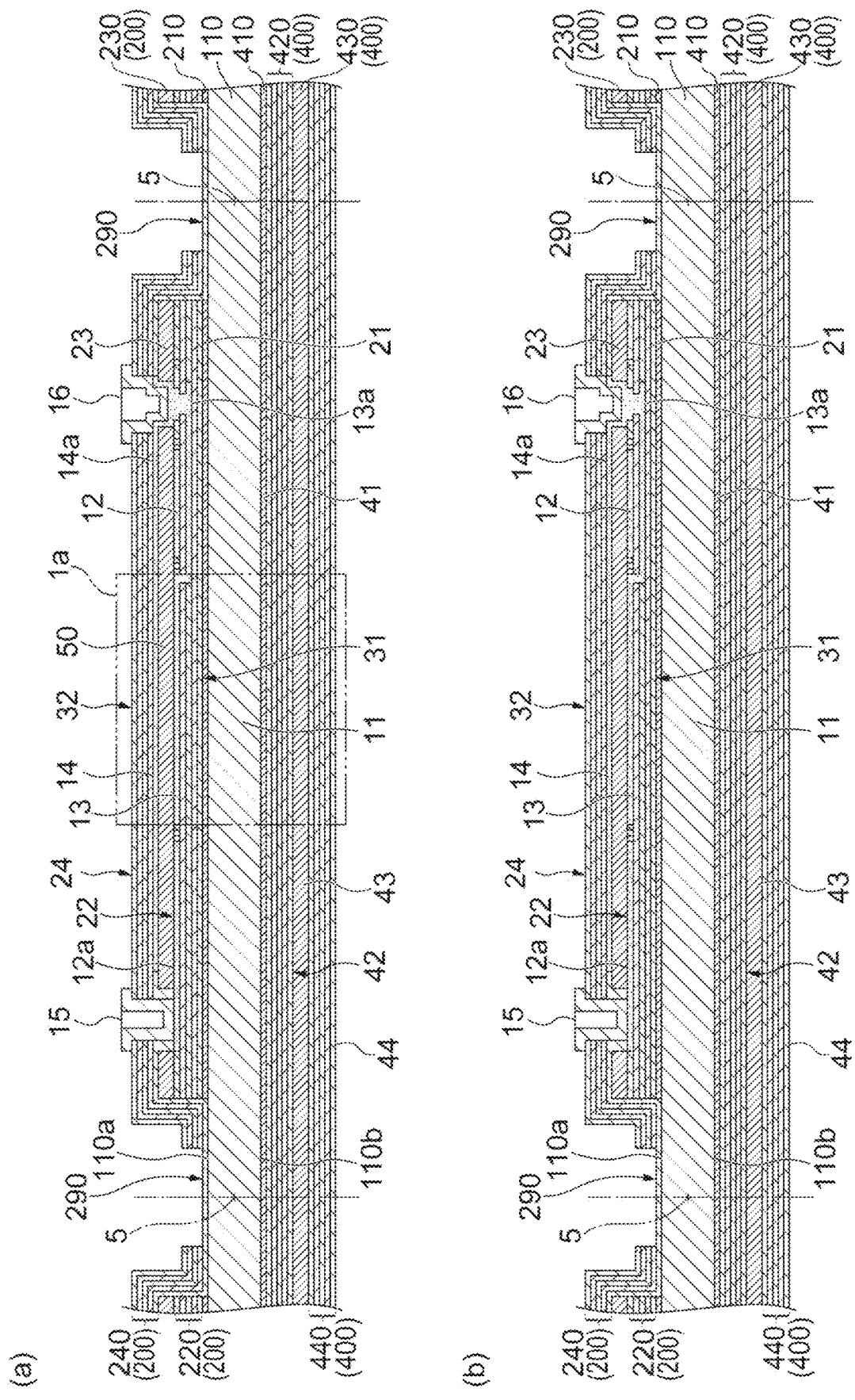
FIG. 11 is a cross-sectional view illustrating a method for manufacturing the wafer illustrated in FIG. 5.

Subsequently, as illustrated in FIG. 11, etching is performed to thin a portion along each of the lines 5 in the second mirror layer 240 so as to expose the surface of the polysilicon layer 27a (refer to FIG. 3) (that is, the polysilicon layer positioned closest to the first surface 110a side) included in the second mirror layer 240. In addition, the etching is performed to form a gap at a portion corresponding to each of the terminals 15 and 16 (refer to FIG. 3) in the second mirror layer 240 for each of portions corresponding to the substrate 11. Subsequently, the terminals 15 and 16 are formed in the gap for each of portions corresponding to the substrate 11, and the terminal 15 and the wiring 12a are connected to each other, while the terminal 16 and each of the wiring 13a and the wiring 14a are connected to each other.

With the procedure above, the reflection prevention layer 210 and the device layer 200 are formed on the first surface 110a of the substrate layer 110, while the first groove 290 is formed in the device layer 200. The first groove 290 is a region where the device layer 200 is partially thinned along each of the lines 5.

Figure 12:
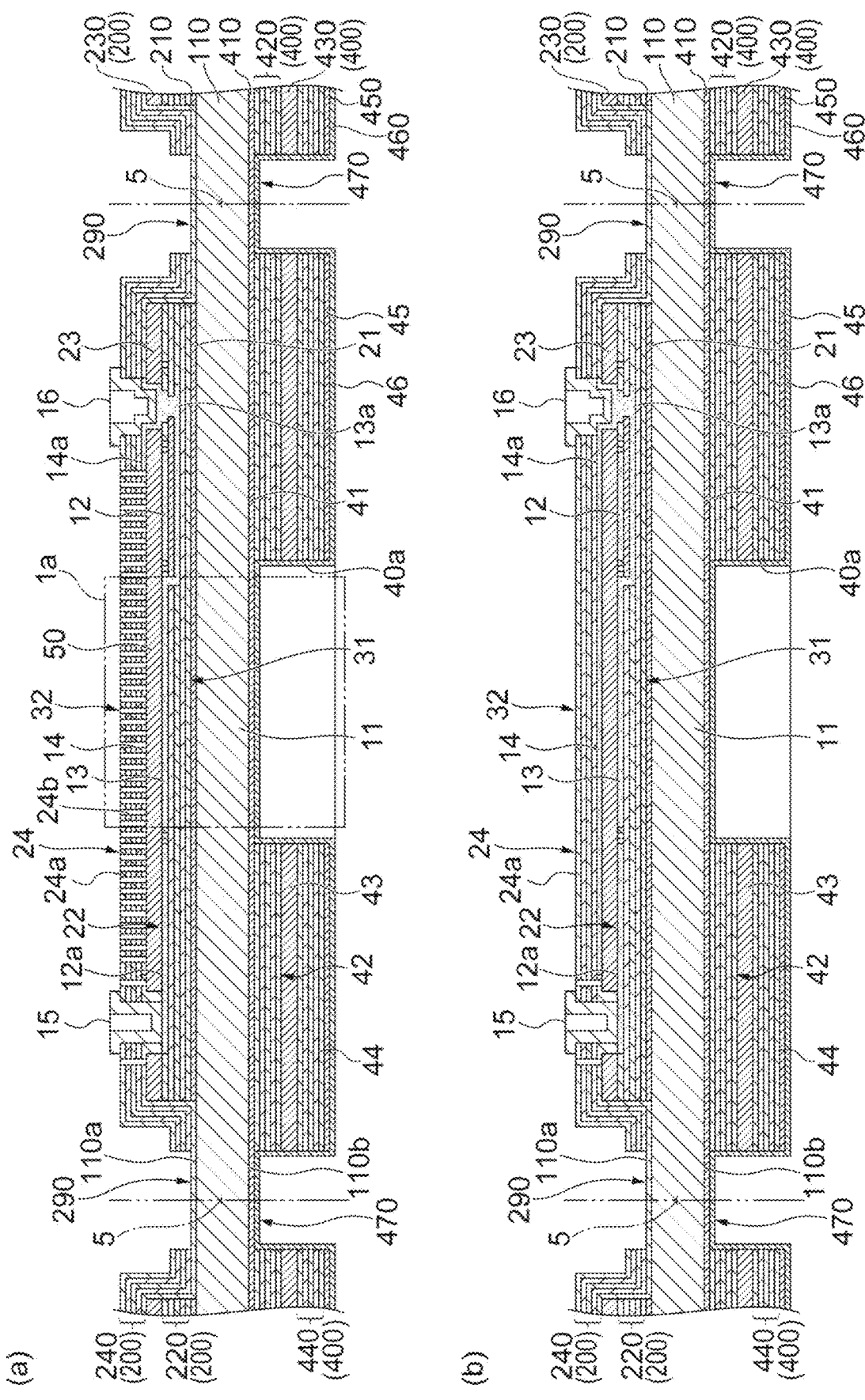
FIG. 12 is a cross-sectional view illustrating a method for manufacturing the wafer illustrated in FIG. 5.

Subsequently, as illustrated in (a) of FIG. 12, etching is performed in each of portions corresponding to the Fabry-Perot interference filter portion 1A so as to form, in the second laminate 24, the plurality of through-holes 24b leading from the surface 24a of the second laminate 24 to the portion 50 expected to be removed. At this time, as illustrated in (b) of FIG. 12, the plurality of through-holes 24b will not be formed in the second laminate 24 in a portion corresponding to each of the dummy filter portions 2A. Subsequently, as illustrated in FIG. 12, the light shielding layer 450 is formed on the layer 440. Subsequently, etching is performed to remove a portion along each of the lines 5 in the light shielding layer 450 and the stress adjustment layer 400 (that is, the layers 420, 430, and 440) so as to expose the surface of the reflection prevention layer 410. In addition, the etching is performed to form the opening 40a in each of portions corresponding to the substrate 11. Subsequently, the protective layer 460 is formed on the light shielding layer 450, the exposed surface of the reflection prevention layer 410, an inner surface of the opening 40a, and the side surface of the stress adjustment layer 400 facing the second groove 470.

With the procedure above, the reflection prevention layer 410, the stress adjustment layer 400, the light shielding layer 450, and the protective layer 460 are formed on the second surface 110b of the substrate layer 110, while the second groove 470 is formed in the stress adjustment layer 400. The second groove 470 is a region in which the stress adjustment layer 400 is partially thinned along each of the lines 5.

Figure 13:
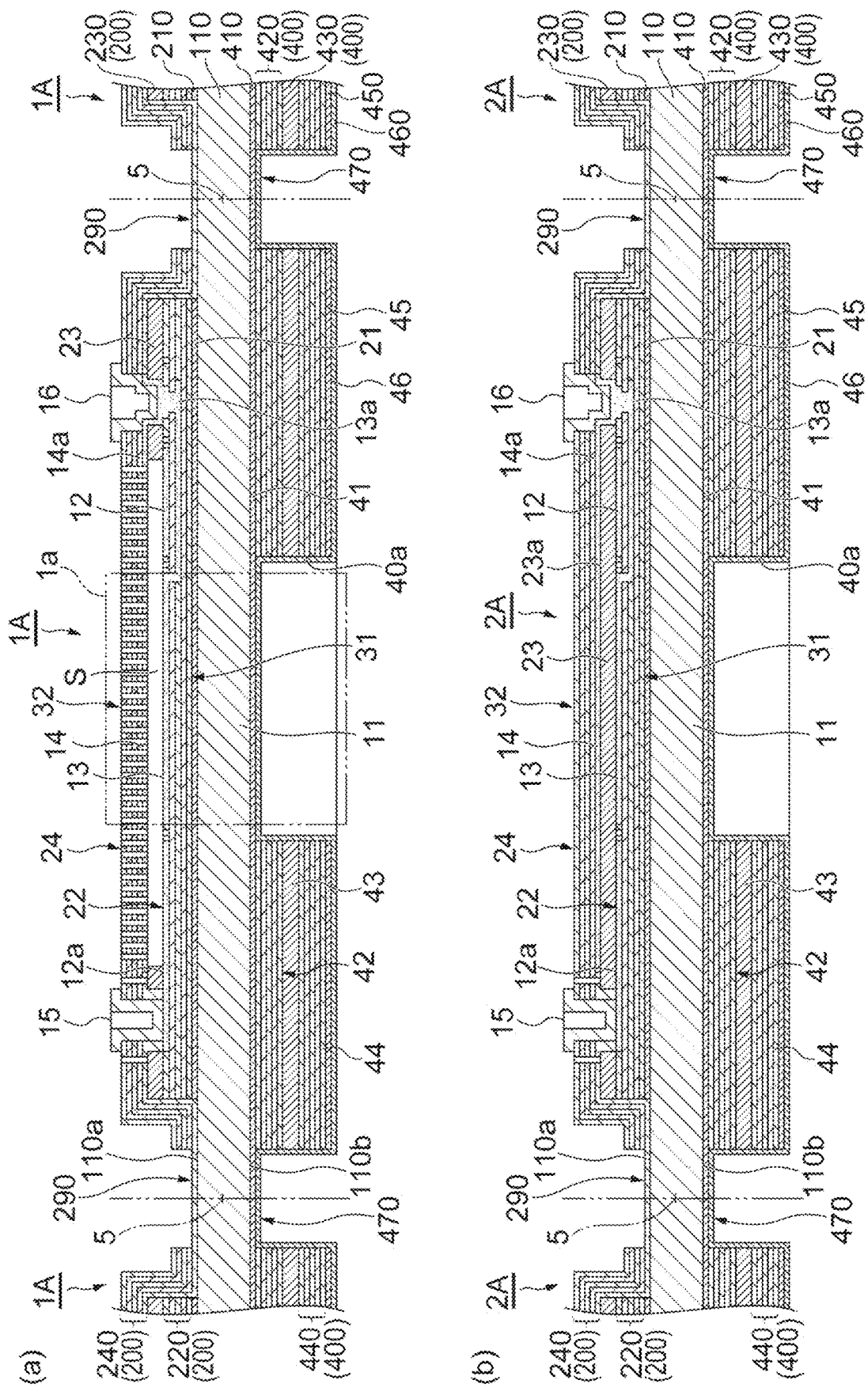
FIG. 13 is a cross-sectional view illustrating a method for manufacturing the wafer illustrated in FIG. 5.

Subsequently, as illustrated in (a) of FIG. 13, etching via a plurality of through-holes 24b (for example, gas phase etching using hydrofluoric acid gas) is performed at a portion corresponding to each of the Fabry-Perot interference filter portions 1A to collectively remove the plurality of portions 50 expected to be removed, from the intermediate layer 230. With this procedure, a gap S is formed in the portion corresponding to each of the Fabry-Perot interference filter portions 1A for each of portions corresponding to the substrate 11. At this time, as illustrated in (b) of FIG. 13, since the plurality of through-holes 24b is not formed in the second laminate 24 at the portion corresponding to each of the dummy filter portions 2A, the gap S will not be formed in the intermediate layer 230.

With the procedure described above, as illustrated in (a) of FIG. 7, the gap S is formed between the first mirror portion 31 and the second mirror portion 32 facing each other in the effective area 101, thereby forming the plurality of Fabry-Perot interference filter portions 1A. In contrast, in the dummy area 102, the intermediate layer 23 is provided between the first mirror portion 31 and the second mirror portion 32 facing each other as illustrated in (b) of FIG. 7, thereby forming the plurality of dummy filter portion 2A.

[Inspection Device and Inspection Method]

Figure 14:
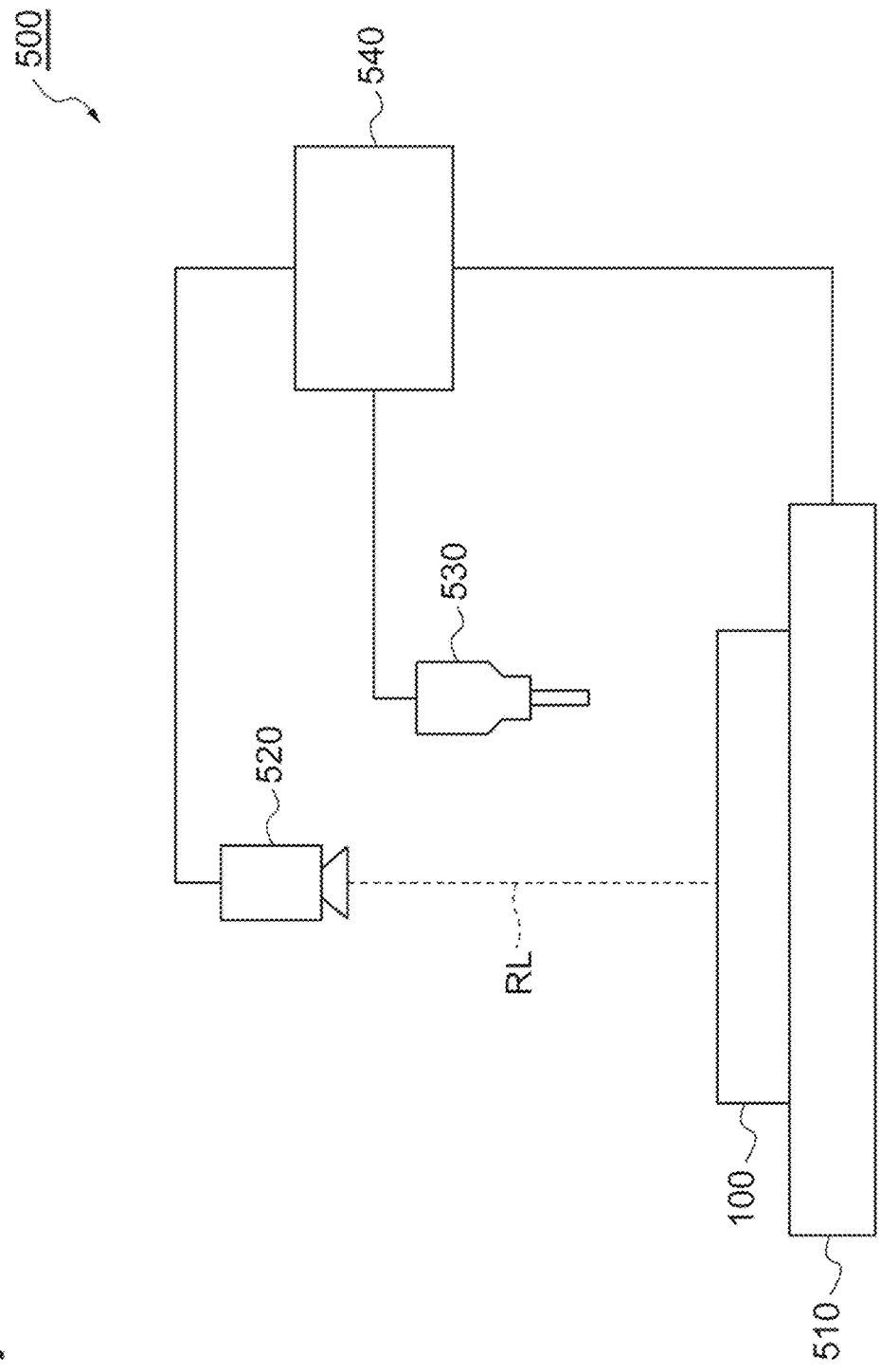
FIG. 14 is a schematic configuration diagram of an inspection device that performs an inspection method according to an embodiment.

Next, a configuration of an inspection device that performs a wafer inspection method of an embodiment will be described. As illustrated in FIG. 14, an inspection device 500 includes a wafer support 510, an imaging unit 520, a marking unit 530, and a control unit 540. The wafer support 510, the imaging unit 520, and the marking unit 530 are disposed in a dark chamber (not illustrated). The inspection target of the inspection device 500 is the wafer 100. As an example, the inspection device 500 has a function of performing an appearance inspection of each of the Fabry-Perot interference filter portions 1A on the wafer 100 (specifically, the surface of the wafer 100), and a function of performing ink marking on the Fabry-Perot interference filter portion 1A determined as faulty in the appearance inspection.

The wafer support 510 supports the wafer 100 such that the facing direction of the wafer 100 (that is, the direction in which first mirror portion 31 and second mirror portion 32 face each other) is parallel to a reference line RL. For example, the wafer support 510 is a stage movable along a plane perpendicular to the reference line RL (at least along each of two directions that are parallel to the plane and orthogonal to each other). The wafer support 510 may be rotatable around a line parallel to the reference line RL as a center line.

The imaging unit 520 images the wafer 100 (specifically, the surface of the wafer 100) supported by the wafer support 510. The imaging unit 520 is a camera that emits observation light along the reference line RL, detects the light reflected on the surface of the wafer 100 supported by the wafer support 510, and outputs imaging data to the control unit 540, for example. The imaging unit 520 is set to image each of the Fabry-Perot interference filter portions 1A on the wafer 100 at a magnification of 10× or more, for example. Although the imaging unit 520 is disposed on the reference line RL, it is possible, for example, to dispose the imaging unit 520 at a position other than on the reference line RL when the mirror member that changes the traveling direction of observation light is disposed on the reference line RL.

Figure 15:
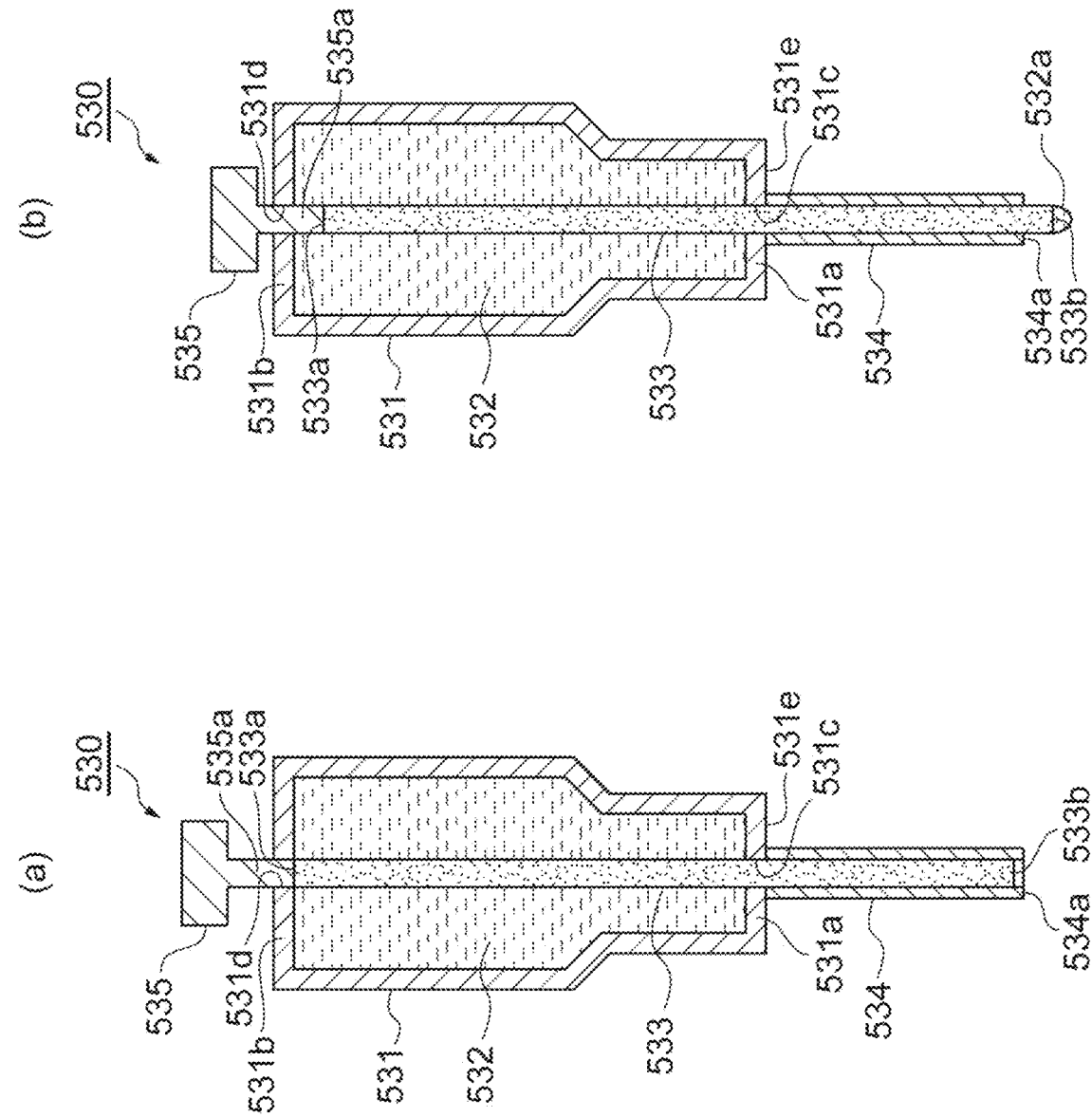
FIG. 15 is a schematic cross-sectional view of a marking unit illustrated in FIG. 14.

The marking unit 530 is a device that performs ink marking on the Fabry-Perot interference filter portion 1A determined as faulty on the basis of imaging data, for example. As illustrated in FIG. 15, as an example, the marking unit 530 includes an ink cartridge 531, ink 532, a filament 533, a metal needle 534, and a pusher 535.

The ink cartridge 531 has a substantially rectangular parallelepiped shape. The ink 532 fills the inside of the ink cartridge 531. Walls 531a and 531b facing each other in the ink cartridge 531 has through-holes 531c and 531d each having a circular cross section.

The ink 532 is, for example, a naturally curable ink that cures by natural drying. Alternatively, however, the ink 532 may be a heat-curable type (for example, a type that cures by heating at 90° C. to 180° C. for several tens of minutes (10 to 40 minutes)), a UV curable type that cures by UV irradiation, or an electron beam curing type that cures by irradiation with an electron a beam, or the like. The viscosity of the ink 532 before curing is in a range from 500 cP (cps) to 50000 cP (cps), for example, and more preferably in a range from 200 cP to 5000 cP. The ink 532 has a distinguishable color such as black. Furthermore, as described above, the ink 532 has a certain viscosity and has an adhesive function. That is, the ink 532 functions as an adhesive having distinctiveness.

The filament 533 has a columnar shape and is formed of a material that absorbs the ink 532. A portion including one end 533a of the filament 533 is disposed in the ink cartridge 531, while a portion including the other end 533b of the filament 533 penetrates the through-hole 531c and extends to the outside of the ink cartridge 531. The ink 532 has penetrated into the filament 533.

The metal needle 534 has a cylindrical shape and is connected to an outer surface 531e of the one wall 531a of the ink cartridge 531. The metal needle 534 is vertically arranged at an opening edge of the through-hole 531c so as to surround the through-hole 531c when viewed in the extending direction of the filament 533. A portion including the other end 533b of the filament 533 is housed inside the metal needle 534.

The pusher 535 has a columnar portion 535a penetrating the through-hole 531d of the ink cartridge 531. The tip of the portion 535a is connected to one end 533a of the filament 533. The portion 535a is movable within a certain range in the extending direction of the filament 533. The above movement of the pusher 535 changes the position of the filament 533 with respect to the ink cartridge 531 and the metal needle 534. Specifically, the above movement of the pusher 535 switches the states between an initial state in which the other end 533b of the filament 533 is located inside a tip 534a of the metal needle 534 (refer to (a) of FIG. 15) and a state in which the other end 533b of the filament 533 is pushed out of the tip 534a of the metal needle 534 (refer to (b) of FIG. 15).

The marking unit 530 is supported by a base member (not illustrated) that operates on the basis of a control signal from the control unit 540, for example. The base member is movable in a direction (Z direction) parallel to the reference line RL and in two directions (X, Y directions) perpendicular to the reference line RL and orthogonal to each other on the basis of the control signal from the control unit 540. Furthermore, the base member can control the movement of the pusher 535 (that is, switching between the state illustrated in (a) of FIG. 15 and the state illustrated in (b) of FIG. 15) on the basis of the control signal from the control unit 540.

The control unit 540 is configured as a computer device including a processor, memory, storage, a communication device, or the like. In the control unit 540, the processor executes a predetermined piece of software (program) read into the memory or the like and controls data reading and writing or the like in the memory or storage, thereby implementing various functions. For example, the control unit 540 controls the operation of each unit (the wafer support 510, the imaging unit 520, and the marking unit 530) to implement the wafer inspection method described below.

In the inspection device 500 configured as described above, the operation of each of units is controlled by the control unit 540, so that the wafer inspection method is performed as follows. First, a wafer 100 as an inspection target is prepared and supported by the wafer support 510. At this time, the wafer 100 is supported by the wafer support 510 such that the facing direction is parallel to the reference line RL.

Subsequently, faulty/non-faulty determination is performed on each of the plurality of Fabry-Perot interference filter portions 1A on the wafer 100 supported by the wafer support 510. Specifically, in order to perform faulty/non-faulty determination of each of the Fabry-Perot interference filter portions 1A on the wafer 100, an inspection on one or more inspection items is performed. As an example, the present embodiment performs an appearance inspection based on an image (imaging data) captured by the imaging unit 520. Specifically, the imaging unit 520 images the wafer 100 supported by the wafer support 510. The imaging data captured by the imaging unit 520 is output to the control unit 540. The control unit 540 can acquire the coordinate information of the Fabry-Perot interference filter portion 1A included in the imaging data on the basis of the position of the imaging unit 520 and the imaging data. The coordinate information is information that specifies the position of the Fabry-Perot interference filter portion 1A on the wafer 100.

Furthermore, the control unit 540 detects an appearance abnormality of the surface of the Fabry-Perot interference filter portion 1A imaged by the imaging unit 520, on the basis of the image processing result on the imaging data. For example, the control unit 540 compares the Fabry-Perot interference filter portion 1A imaged by the imaging unit 520 with the previously stored pattern image (image of the Fabry-Perot interference filter portion without appearance abnormality), and thereby determines whether there is an appearance abnormality such as a breakage, crack, foreign substance, or dirt on the surface of the imaged Fabry-Perot interference filter portion 1A. The control unit 540 determines the Fabry-Perot interference filter portion 1A determined to have such an appearance abnormality, as faulty (failure). Thereafter, the control unit 540 stores information (a failure flag) indicating that the Fabry-Perot interference filter portion 1A is faulty in association with the information (for example, coordinate information) that specifies the Fabry-Perot interference filter portion 1A determined as faulty.

Instead of performing the above-described image processing (comparison with the pattern image in the present embodiment), the control unit 540 may display imaging data on a display (not illustrated) of the inspection device 500 and have an operator visually check the presence or absence of appearance abnormality. When an appearance abnormality is discovered by visual check, the operator can use an input device (not illustrated) such as a keyboard provided in the inspection device 500, for example, to input information (for example, checking on a check box) indicating the discovery of the appearance abnormality. In this case, the control unit 540 only has to store the failure flag in association with the information specifying the Fabry-Perot interference filter portion 1A having an input of the information indicating the discovery of the appearance abnormality.

The above-described appearance inspection is performed on the basis of the following criteria, for example.

<Criteria>

The second mirror layer 240 has no breakage, crack, foreign substance or dirt in a portion overlapping the gap S when viewed in the facing direction.

Normal patterns are formed on the terminals 15 and 16 with no chipped or corroded portions.

The Fabry-Perot interference filter portion 1A has no foreign substance or dirt on its entire surface.

For example, the control unit 540 determines that the Fabry-Perot interference filter portion 1A is non-faulty when the Fabry-Perot interference filter portion 1A as a determination target satisfies all the above-described criteria. In contrast, the control unit 540 determines that the Fabry-Perot interference filter portion 1A is a faulty product (faulty) when the Fabry-Perot interference filter portion 1A does not satisfy at least one of the above-described criteria.

By sequentially executing the above-described inspection (here, the appearance inspection) on each of the Fabry-Perot interference filter portions 1A on the wafer 100, the control unit 540 can specify the Fabry-Perot interference filter portion 1A determined as faulty from among the plurality of Fabry-Perot interference filter portions 1A on the wafer 100. For example, the control unit 540 controls the operation of the wafer support 510 to move the next Fabry-Perot interference filter portion 1A onto the reference line RL every time the inspection of one Fabry-Perot interference filter portion 1A is completed. Thereafter, the control unit 540 similarly performs an inspection on the next Fabry-Perot interference filter portion 1A. Thereafter, the inspection of each of the Fabry-Perot interference filter portions 1A is sequentially performed in a similar manner.

The inspection for performing faulty/non-faulty determination of each of the Fabry-Perot interference filter portions 1A is not limited to the above-described appearance inspection (surface appearance inspection), and may include inspections on various other viewpoints. For example, the inspection device 500 may further include a mechanism for performing an appearance inspection of the back surface (the surface on the second surface 110b side of the substrate layer 110) of the Fabry-Perot interference filter portion 1A. The appearance inspection is performed on the basis of the following criteria, for example.

<Criteria for Back Surface Appearance Inspection>

No foreign substance or dirt exists in the light transmission region 1a (in the opening 40a).

The protective layer 46 has no chipping to the degree as to reveal the underlying layer (light shielding layer 45).

In addition, the inspection device 500 may include a mechanism to perform an optical inspection concerning whether the characteristics of the Fabry-Perot interference filter portion 1A (for example, the relationship between the level of the applied voltage and the wavelength (wavelength at which the detection intensity reaches a peak at each of voltages) of transmitted light) is within a predetermined range. Furthermore, the inspection device 500 may include a mechanism to perform an electrical inspection of the Fabry-Perot interference filter portion 1A. An example of the electrical inspection is an inspection based on a measurement result of a leakage current when a voltage is applied between the terminals 15 and 16 or capacitance (corresponding to electrostatic capacitance generated between the first electrode 12 and the third electrode 14 in the Fabry-Perot interference filter portion 1A).

When the inspection device 500 performs an inspection regarding a plurality of inspection items such as the above-described appearance inspection (front and back surfaces), an optical inspection, and an electrical inspection as an inspection for performing faulty/non-faulty determination of each of the Fabry-Perot interference filter portions 1A in the wafer 100, the failure flag will be associated with a Fabry-Perot interference filter determined as faulty in an inspection regarding at least one inspection item.

Subsequently, after completing the faulty/non-faulty determination of all the Fabry-Perot interference filter portions 1A on the wafer 100, the control unit 540 sequentially applies the ink 532 to one or more Fabry-Perot interference filter portions 1A determined as faulty. Specifically, the control unit 540 controls the operation of the marking unit 530 to apply the ink 532 to at least part of a portion overlapping with the gap S when viewed in the facing direction (hereinafter, simply referred to as a "membrane portion") on the second mirror layer 240 of the Fabry-Perot interference filter portion 1A determined as faulty. More specifically, the control unit 540 controls the operation of the marking unit 530 so that the other end 533b of the filament 533 of the marking unit 530 is pushed outward from the tip 534a of the metal needle 534 (refer to (b) of FIG. 15), and an ink reservoir 532a formed at the other end 533b of the filament 533 is pressed against at least part of the membrane portion of the Fabry-Perot interference filter portion 1A determined as faulty.

When there is a plurality of Fabry-Perot interference filter portions 1A determined as faulty, the control unit 540 controls to move the position of the marking unit 530 to the marking position of the next Fabry-Perot interference filter portion 1A every time the marking on one Fabry-Perot interference filter portion 1A is completed, for example, and performs marking for the next Fabry-Perot interference filter portion 1A in a similar manner. Hereinafter, marking will be sequentially performed in a similar manner on each of the Fabry-Perot interference filter portions 1A determined as faulty. The alignment between the marking unit 530 and the Fabry-Perot interference filter portion 1A determined as faulty may be performed by moving the marking unit 530 as described above, or by moving the wafer support 510, or may be performed by moving both the marking unit 530 and the wafer support 510.

Figure 16:
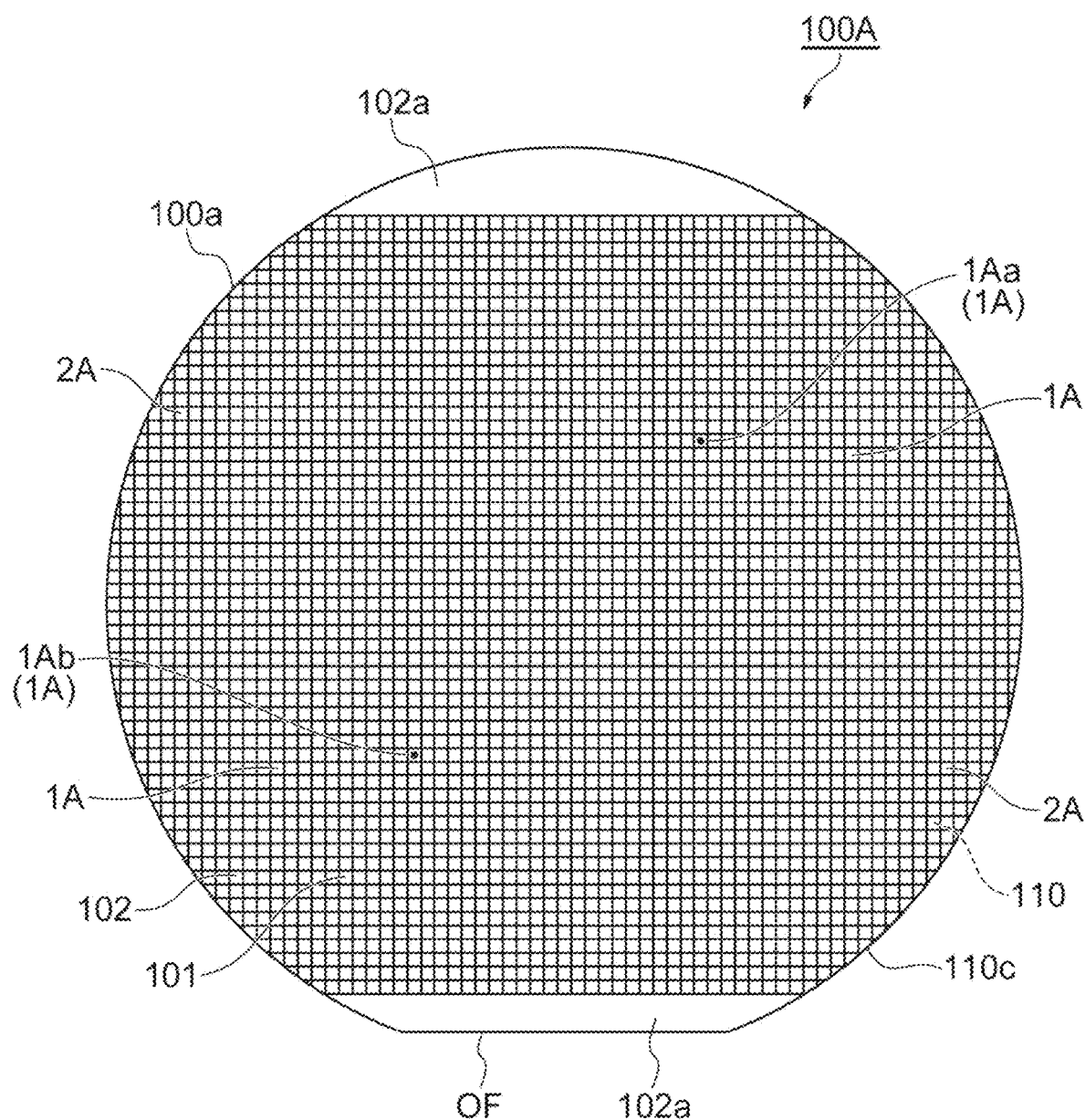
FIG. 16 is a plan view of the wafer after marking is performed.

With the above process, it is possible to obtain, as illustrated in FIG. 16, a wafer 100A in which the ink 532 has been applied to at least one faulty Fabry-Perot interference filter portion 1A (here, two Fabry-Perot interference filter portions 1Aa and 1Ab) while no ink 532 has been applied to at least one non-faulty Fabry-Perot interference filter portion 1A (here, Fabry-Perot interference filter portion 1A other than Fabry-Perot interference filter portions 1Aa and 1Ab) among the plurality of Fabry-Perot interference filter portions 1A. Here, the "faulty Fabry-Perot interference filter portion 1A" is a Fabry-Perot interference filter portion 1A that has been determined as faulty by the above-described inspection for performing the faulty/non-faulty determination. The "non-faulty Fabry-Perot interference filter portion 1A" is a Fabry-Perot interference filter portion 1A that has not been determined as faulty by the above-described inspection for performing the faulty/non-faulty determination.

In the present embodiment, as an example, the membrane portion is not broken in the Fabry-Perot interference filter portion 1Aa illustrated in (a) of FIG. 17. Such a Fabry-Perot interference filter portion 1Aa is, for example, a Fabry-Perot interference filter portion 1A determined as faulty by the above-described characteristic inspection (optical inspection, electrical inspection).

In contrast, the Fabry-Perot interference filter portion 1Ab illustrated in (b) of FIG. 17 includes the membrane portion having a broken part C such as a tear or a crack. Such a Fabry-Perot interference filter portion 1Ab is, for example, a Fabry-Perot interference filter portion 1A determined as faulty by both or one of the above-described appearance inspection and characteristic inspection.

In the example of FIG. 17, a marking M in the ink 532 is formed in at least part of the membrane portion (here, as an example, a circular region substantially overlapping the second mirror portion 32) in each of the Fabry-Perot interference filter portions 1Aa and 1Ab. The diameter of the marking M (spot diameter of the ink 532 applied by the marking unit 530) is about 750 µm, for example.

[Method of Manufacturing Fabry-Perot Interference Filter]

Figure 18:
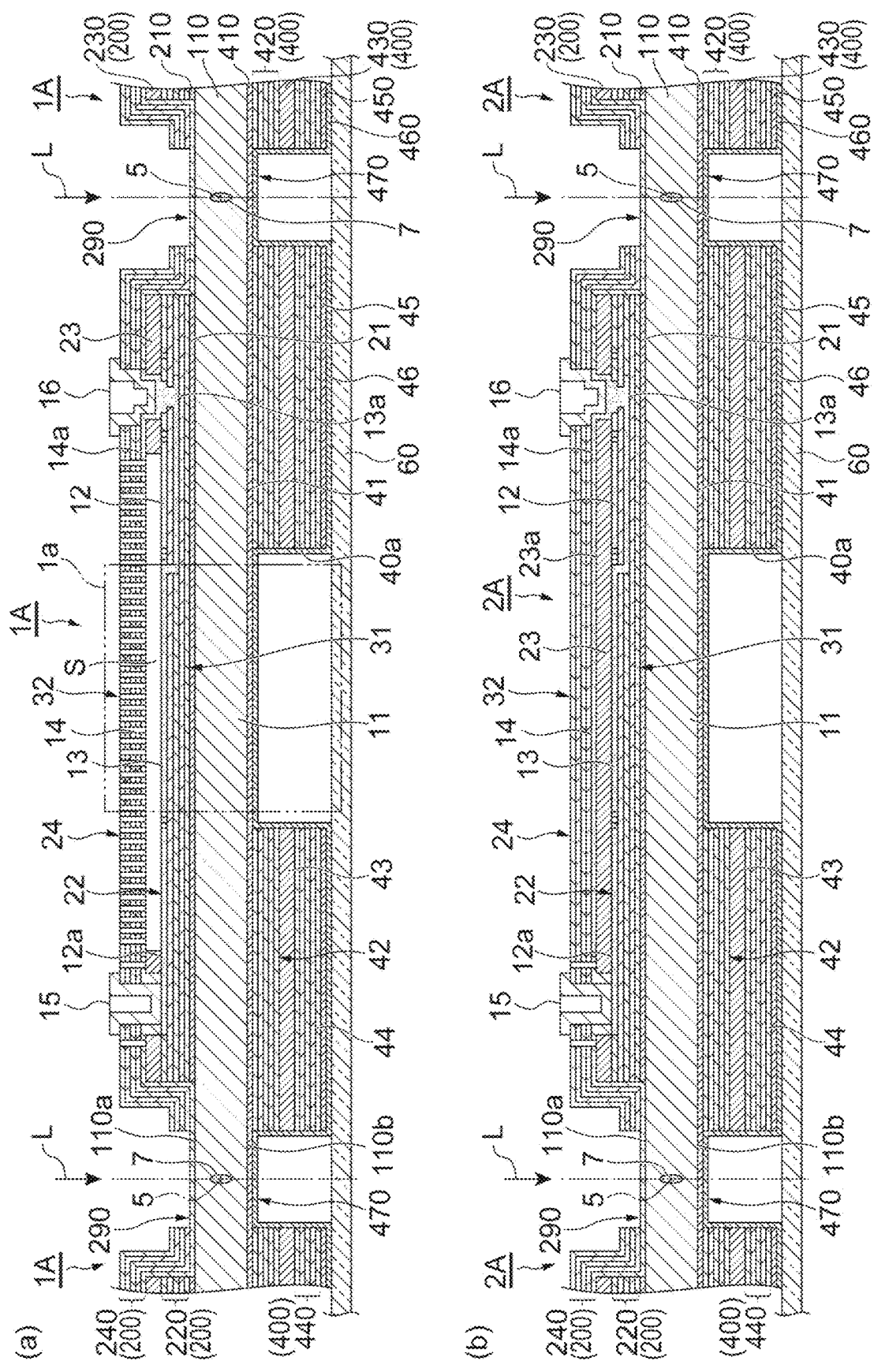
FIG. 18 is a cross-sectional view illustrating a method for cutting out a Fabry-Perot interference filter from the wafer illustrated in FIG. 5.
Figure 19:
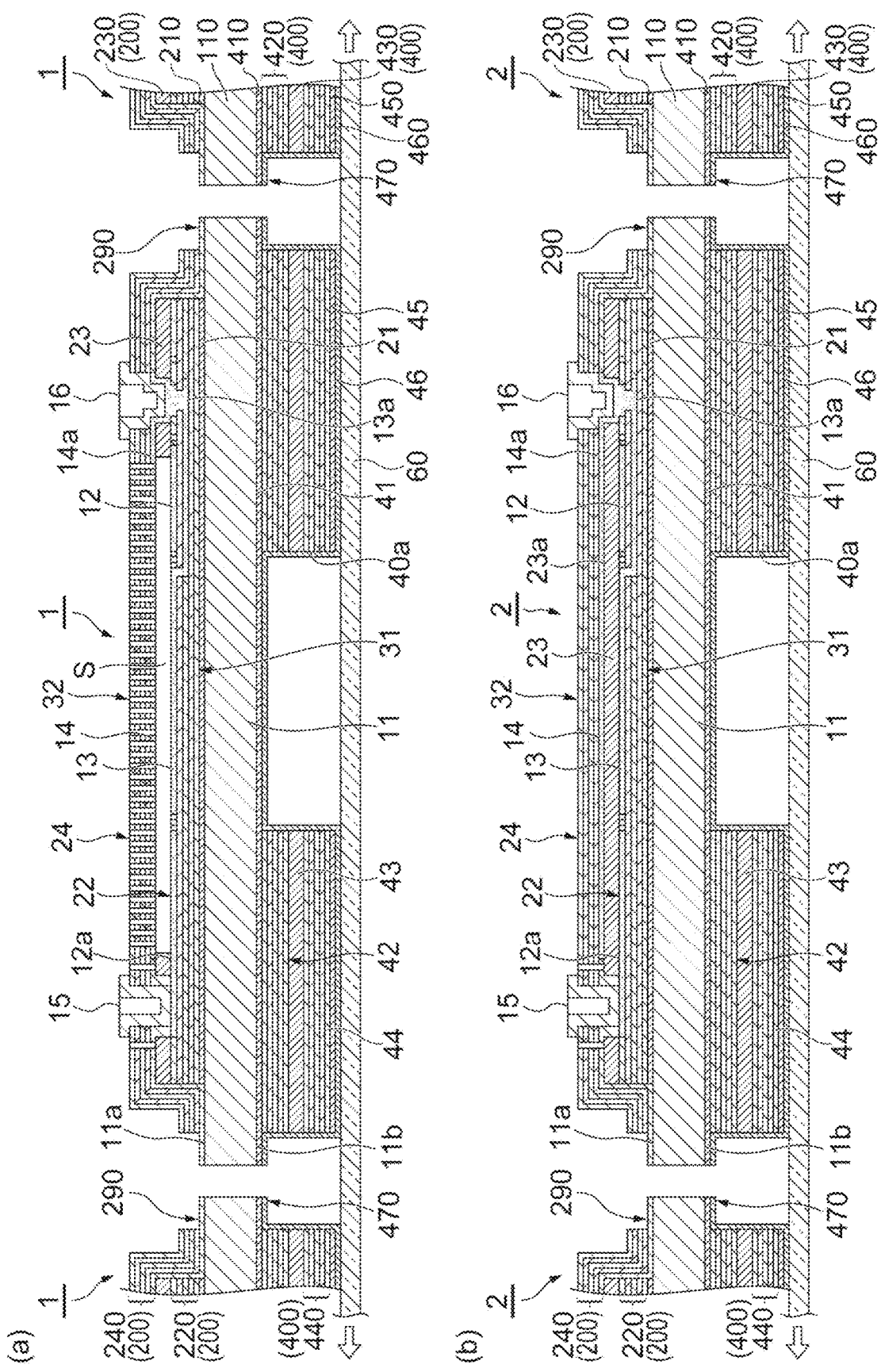
FIG. 19 is a cross-sectional view illustrating a method for cutting out a Fabry-Perot interference filter from the wafer illustrated in FIG. 5.

Next, a method for cutting out the Fabry-Perot interference filter 1 from the wafer 100 (a method of manufacturing the Fabry-Perot interference filter 1) will be described with reference to FIGS. 18 and 19. In FIGS. 18 and 19, (a) is cross-sectional view of a portion corresponding to the Fabry-Perot interference filter portion 1A, and (b) is a cross-sectional view of a portion corresponding to the dummy filter portion 2A.

First, as illustrated in FIG. 18, an expanding tape 60 is attached onto the protective layer 460 (that is, to the second surface 110b side). Subsequently, laser light L is applied from a side opposite to the expanding tape 60 in a state where the expanding tape 60 is attached to the second surface 110b side, and then a converging point of the laser light L is relatively moved along each of the lines 5 while a converging point of the laser light L is positioned within the substrate layer 110. That is, the laser light L is controlled to be incident on the substrate layer 110 from the side opposite to the expanding tape 60 through the surface of the polysilicon layer exposed in the first groove 290.

With the irradiation of the laser light L, a modified region 7 is formed within the substrate layer 110 along each of the lines 5. The modified region 7 is a region having physical characteristics such as density, a refractive index, mechanical strength different from those in the surrounding area, and is a region to be a start point of a fracture extending in a thickness direction of the substrate layer 110. Examples of the modified region 7 include molten processed regions (which means at least any one of a region resolidified after melting, a region in a melted state, and a region in a state of being resolidified from the melted state), a crack region, a dielectric breakdown region, a refractive index changed region, or the like, or a mixed region of these. Further examples of the modified region 7 include a region where the density of the modified region 7 has changed from that of an unmodified region, a region with a lattice defect, or the like, in the material of the substrate layer 110. When the material of the substrate layer 110 is monocrystalline silicon, the modified region 7 can also be defined as a high-dislocation density region. The number of rows of the modified regions 7 arranged in the thickness direction of the substrate layer 110 with respect to each of the lines 5 is appropriately adjusted on the basis of the thickness of the substrate layer 110.

Subsequently, as illustrated in FIG. 19, the expanding tape 60 attached to the second surface 110b side is expanded so as to extend the fracture in the thickness direction of the substrate layer 110 from the modified region 7 formed within the substrate layer 110, and then, the substrate layer 110 is cut into the plurality of substrates 11 along each of the lines 5. At this time, the polysilicon layer of the second mirror layer 240 is cut along each of the lines 5 in the first groove 290, while the reflection prevention layer 410 and the protective layer 460 are cut along each of the lines 5 in the second groove 470. With this procedure, a plurality of Fabry-Perot interference filters 1 and the plurality of dummy filters 2 in a state of being separated from each other on the expanding tape 60 are obtained. Note that among the plurality of Fabry-Perot interference filters 1, the Fabry-Perot interference filter 1 to which the marking M has been attached will be removed after being cut out from the wafer 100 so as not to be used for manufacturing a light detection device 10 described below.

[Configuration of Light Detection Device]

Next, a configuration of a light detection device 10 including the Fabry-Perot interference filter 1 will be described. As illustrated in FIG. 20, the light detection device 10 includes a package 71. The package 71 is a CAN package including a stein 72 and a cap 73. The cap 73 is integrally formed by a side wall 74 and a top wall 75. The stein 72 and the cap 73 are formed of a metal material and are hermetically joined to each other. In the package 71 formed of a metal material, the shape of the side wall 74 is cylindrical about a line 9 as a center line. The stein 72 and the top wall 75 face each other in a direction parallel to the line 9, and close both ends of the side wall 74, individually.

A wiring substrate 76 is secured to an inner surface 72a of the stein 72. Examples of a material applicable as the wiring substrate 76 include silicon, ceramic, quartz, glass, plastic, or the like. The light detector (light detection unit) 77 and a temperature detector (not illustrated) such as a thermistor are mounted on the wiring substrate 76. The light detector 77 is disposed on the line 9. More specifically, the light detector 77 is disposed such that the center line of a light receiving portion thereof is aligned with the line 9. The light detector 77 is an infrared detector such as a quantum type sensor using InGaAs or other compounds or a thermal type sensor using a thermopile or a bolometer or the like. In a case of detecting light of different wavelength bands of ultraviolet, visible, and near infrared regions, for example a silicon photodiode or the like can be used as the light detector 77. Note that the light detector 77 may include one light receiving portion, or a plurality of light receiving portions provided in an array. Furthermore, a plurality of light detectors 77 may be mounted on the wiring substrate 76. The temperature detector may be disposed at a position close to the Fabry-Perot interference filter 1, for example, so that a temperature change of the Fabry-Perot interference filter 1 can be detected.

A plurality of spacers 78 is secured onto the wiring substrate 76. Examples of a material applicable as the spacers 78 include silicon, ceramic, quartz, glass, plastic, or the like. The Fabry-Perot interference filter 1 is secured onto the plurality of spacers 78 by adhesive, for example. Fabry- Perot interference filter 1 is disposed on the line 9. More specifically, the Fabry-Perot interference filter 1 is disposed such that the center line of the light transmission region 1a is aligned with the line 9. Note that the spacers 78 may be integrally formed with the wiring substrate 76. The Fabry-Perot interference filter 1 may be supported by a single spacer 78, rather than by the plurality of spacers 78.

A plurality of lead pins 81 is secured to the stein 72. More specifically, each of the lead pins 81 penetrates through the stein 72 in a state where electrical insulation and hermeticity between the lead pin 81 and the stein 72 are maintained. Each of the lead pins 81 is electrically connected by wires 82 to each of electrode pads provided on the wiring substrate 76, a terminal of the light detector 77, a terminal of the temperature detector, and a terminal of the Fabry-Perot interference filter 1. The light detector 77, the temperature detector, and the Fabry-Perot interference filter 1 may be electrically connected to each of the lead pins 81 via the wiring substrate 76. For example, each of terminals may be electrically connected to an electrode pad provided on the wiring substrate 76, while the electrode pad and each of the lead pins 81 may be connected by the wire 82. This enables input and output of electric signals to and from each of the light detector 77, the temperature detector, and the Fabry-Perot interference filter 1.

The package 71 has an opening 71a. More specifically, the opening 71a is formed in the top wall 75 of the cap 73 such that the center line thereof is aligned with the line 9. The shape of the opening 71a is circular when viewed in a direction parallel to the line 9. A light transmitting member 83 is disposed on an inner surface 75a of the top wall 75 so as to close the opening 71a. The light transmitting member 83 is hermetically joined to the inner surface 75a of the top wall 75. The light transmitting member 83 has a light incident surface 83a and a light emission surface 83b (inner surface) opposite to the light incident surface 83a in a direction parallel to line 9, and has side surfaces 83c.

The light incident surface 83a of the light transmitting member 83 is substantially flush with an outer surface of the top wall 75 at the opening 71a. The side surface 83c of the light transmitting member 83 is in contact with an inner surface 74a of the side wall 74 of the package 71. That is, the light transmitting member 83 reaches the inside of the opening 71a and the inner surface 74a of the side wall 74. Such a light transmitting member 83 is formed by disposing a glass pellet inside the cap 73 with the opening 71a facing down and melting the glass pellet. That is, the light transmitting member 83 is formed of fused glass.

A band pass filter 84 is secured to the light emission surface 83b of the light transmitting member 83 by a bonding member 85. That is, the bonding member 85 secures the band pass filter 84 to the inner surface 75a of the top wall 75 via the light transmitting member 83 joined to the inner surface 75a of the top wall 75. The band pass filter 84 selectively transmits light with a measurement wavelength range by the light detection device 10 (light with a predetermined wavelength range and should be incident on the light transmission region 1a of the Fabry-Perot interference filter 1) out of light transmitted through the light transmitting member 83 (that is, the band pass filter 84 transmits only the light with the wavelength range). The band pass filter 84 has a rectangular plate shape. More specifically, the band pass filter 84 has a light incident surface 84a and a light emission surface 84b opposite to the light incident surface 84a in a direction parallel to the line 9, and has four side surfaces 84c. The band pass filter 84 is obtained by forming a dielectric multilayer film (for example, a multilayer film combining a high refractive material such as $TiO_2$ and $Ta_2O_5$ and a low refractive material such as $SiO_2$ and $MgF_2$) on a surface of a light transmitting member formed in a rectangular shape using a light transmitting material (for example, silicon, glass, or the like).

The bonding member 85 includes a first portion 85a arranged over the entire region of the light incident surface 84a of the band pass filter 84. That is, the first portion 85a in the bonding member 85 is a portion arranged between the light emission surface 83b of the light transmitting member 83 and the light incident surface 84a of the band pass filter 84 facing each other. The bonding member 85 further includes a second portion 85b protruding outward from the outer edge of the band pass filter 84 when viewed in a direction parallel to the line 9. The second portion 85b reaches the inner surface 74a of the side wall 74 and is in contact with the inner surface 74a of the side wall 74. Furthermore, the second portion 85b is in contact with the side surface 84c of the band pass filter 84.

In the light detection device 10 configured as described above, when light is incident on the band pass filter 84 from outside via the opening 71a, the light transmitting member 83, and the bonding member 85, light with a predetermined wavelength range is selectively transmitted. When the light transmitted through the band pass filter 84 is incident on the light transmission region 1a of the Fabry-Perot interference filter 1, light with a predetermined wavelength out of the light with the predetermined wavelength range is selectively transmitted. The light transmitted by the light transmission region 1a of the Fabry-Perot interference filter 1 is incident on the light receiving portion of the light detector 77 and is detected by the light detector 77. That is, the light detector 77 converts the light transmitted through the Fabry-Perot interference filter 1 into an electric signal and outputs the electric signal. For example, the light detector 77 outputs an electric signal of a strength corresponding to the intensity of the light incident on the light receiving portion.

[Effects of Wafer Inspection Method and Wafer]

The wafer inspection method described above includes a step of performing a faulty/non-faulty determination of each of the plurality of Fabry-Perot interference filter portions 1A, and a step of applying the ink 532 to at least part of a portion overlapping the gap S when viewed in the facing direction (membrane portion) on the second mirror layer 240 of the Fabry-Perot interference filter portion 1A determined as faulty in the step of performing faulty/non-faulty determination.

In the wafer inspection method according to one aspect of the present disclosure, inspection (faulty/non-faulty determination) of each of the plurality of Fabry-Perot interference filter portions 1A is performed in a state where each of the plurality of Fabry-Perot interference filter portions 1A to be a Fabry-Perot interference filter 1 is integrated (that is, in a wafer state). This makes it possible to perform the inspection more efficiently as compared with a case of individually inspecting the Fabry-Perot interference filters 1 singulated by cutting the wafer 100. Furthermore, the above inspection method applies the ink 532 to at least part of the fragile portion (membrane portion) having a membrane structure in the Fabry-Perot interference filter portion 1A determined as faulty (Fabry-Perot interference filter portion 1Aa and 1Ab in the present embodiment). This makes it possible to suppress the curling of a broken portion (broken part C), generation of particles from the broken portion, in a case where the membrane portion of the second laminate 24 is broken as in the case of the Fabry-Perot interference filter portion 1Ab illustrated in (b) of FIG. 17. Specifically, broken portions (or a broken portion and a non-broken portion) are fixed to each other via the viscous ink 532, making it possible to enhance the strength of the membrane portion and suppress the progress of the breakage in the membrane portion. Furthermore, even in a case where the membrane portion is not broken as in the Fabry-Perot interference filter portion 1Aa illustrated in (a) of FIG. 17, the possibility of future breakage of the membrane portion can be reduced by reinforcing the membrane portion with the ink 532. As described above, according to the above-described wafer inspection method, it is possible to inhibit a broken Fabry-Perot interference filter from adversely affecting other Fabry-Perot interference filters while improving inspection efficiency.

Moreover, at least part of the membrane portion to which the ink 532 is applied has a through-hole (a plurality of through-holes 24b in the present embodiment) penetrating from the surface of the second mirror layer 240 opposite to the first mirror layer 220 (the surface to be the surface 24a by cutting the wafer 100 along each of the lines 5) to reach the gap S. This allows the ink 532 to penetrate from the surface of the second mirror layer 240 to the inside (the gap S) through the through-hole 24b. As a result, the second mirror layer 240 is reinforced by the ink 532. Therefore, in the Fabry-Perot interference filter portion 1Ab illustrated in (b) of FIG. 17, it is possible to effectively suppress the curling of the broken part C of the second mirror layer 240 and generation of particles from the broken part C. Moreover, even in a case where the membrane portion of the Fabry-Perot interference filter portion 1Aa determined as faulty is not broken as illustrated in (a) of FIG. 17, it is possible to effectively reduce the possibility of future breakage of the membrane portion by ink 532 penetrating into the gap S. Regarding the Fabry-Perot interference filter portion 1Ab, while it is considered that the ink 532 penetrates into the gap S via the broken part C formed in the membrane portion, formation of the through-hole 24b would be able to further effectively allow the ink 532 to penetrate into the gap S.

Furthermore, in the step of applying the ink 532 in the above-described wafer inspection method, the ink 532 is sequentially applied to one or more Fabry-Perot interference filter portions 1A determined as faulty after completion of the faulty/non-faulty determination of all the Fabry-Perot interference filter portions 1A in the step of performing faulty/non-faulty determination. In this case, it is possible to collectively perform the marking with the ink 532 on one or more Fabry-Perot interference filter portions 1A determined as faulty after completion of the inspection (faulty/non-faulty determination) for all the Fabry-Perot interference filter portions 1A, making it possible to perform the marking efficiently. That is, by completely separating the step of performing the faulty/non-faulty determination for all Fabry-Perot interference filter portions 1A and the step of applying the ink 532 to one or more Fabry-Perot interference filter portions 1A determined as faulty, it is possible to simplify control of processes in individual steps. In this case, the device that performs the ink marking may be a device different from the device that performs the inspection for faulty/non-faulty determination.

Meanwhile, in the step of applying the ink 532 according to a modification of the above-described wafer inspection method, the ink 532 may be applied to one Fabry-Perot interference filter portion 1A determined as faulty every time the one Fabry-Perot interference filter portion 1A is determined as faulty in the step of performing faulty/non-faulty determination. Specifically, the ink 532 may be applied to one Fabry-Perot interference filter portion 1A determined as faulty every time the one Fabry-Perot interference filter portion 1A is determined as faulty in a certain inspection (for example, an inspection concerning one inspection item among the above-described appearance inspection, the characteristic inspection, or the like). In this case, every time of a discovery of a Fabry-Perot interference filter portion 1A determined as faulty in the inspection concerning the one inspection item, marking is immediately performed on the Fabry-Perot interference filter portion 1A. This makes it possible to immediately apply the ink 532 to a Fabry-Perot interference filter portion that can adversely affect other Fabry-Perot interference filter portions 1A (for example, a Fabry-Perot interference filter portion 1Ab that is broken and might generate particles). As a result, adverse effects on other Fabry-Perot interference filter portions 1A can be further effectively suppressed.

The viscosity of the ink 532 before curing is in a range from 500 cP to 50000 cP, and more preferably in a range from 200 cP to 5000 cP. With the use of the ink 532 having such viscosity, it is possible to preferably suppress the curling of the broken portion of the second mirror layer 240 (membrane portion) and the generation of particles from the broken portion.

In addition, in the wafer 100A to which the marking M of the ink 532 is applied, each of the plurality of Fabry-Perot interference filter portions 1A to be a Fabry-Perot interference filter 1 is integrated. Accordingly, it is possible to efficiently perform the faulty/non-faulty determination (inspection) on each of the Fabry-Perot interference filter portions 1A. In addition, for example, in the Fabry-Perot interference filter portion 1A determined as faulty as a result of the inspection, the ink 532 is applied to at least part of the above-described portion having a membrane structure (membrane portion). Accordingly, in a case where the membrane portion is broken, curling of the broken portion, generation of particles from the broken portion, or the like, is suppressed. Furthermore, even in a case where the membrane portion is not broken, the possibility of future breakage of the membrane portion is reduced by reinforcing the membrane portion with the ink 532. As described above, according to the above-described wafer 100A, it is possible to inhibit a broken Fabry-Perot interference filter from adversely affecting other Fabry-Perot interference filters while improving inspection efficiency. Furthermore, by attaching the marking M in the ink 532, it is possible to easily confirm the broken portion of the wafer 100A (the broken Fabry-Perot interference filter portions 1Aa and 1Ab).

In the wafer 100A, the ink 532 has penetrated into the gaps S formed in the faulty Fabry-Perot interference filter portion 1A. Specifically, part of the ink 532 applied by the marking unit 530 has penetrated into the gap S via at least one of the plurality of through-holes 24b or the broken part C formed in the membrane portion. This enables the Fabry-Perot interference filter portion 1Ab illustrated in (b) of FIG. 17 to fix the second mirror layer 240 to the first mirror layer 220 by the ink 532 penetrated into the gap S, making it possible to effectively suppress the curling of the broken part C of the second mirror layer 240, generation of particles from the broken part C, or the like. Moreover, even in a case where the membrane portion is not broken as in the Fabry-Perot interference filter portion 1Aa illustrated in (a) of FIG. 17, it is possible to effectively reduce the possibility of future breakage of the membrane portion by the ink 532 penetrating into the gap S.

In the wafer 100, the plurality of Fabry-Perot interference filter portions 1A to be the plurality of Fabry-Perot interference filters 1 is provided in the effective area 101. In addition, the plurality of dummy filter portions 2A is provided in the dummy area 102 provided along the outer edge 110c of the substrate layer 110 to surround the effective area 101, and the intermediate layer 23 is provided between the first mirror portion 31 and the second mirror portion 32 facing each other in each of the dummy filter portions 2A. This configuration sufficiently ensures the strength of the entire wafer 100. This facilitates handling of the wafer 100 when the above-described inspection method is implemented on each of Fabry-Perot interference filter portions 1A. Furthermore, since warpage of the wafer 100 can be suppressed, it is possible to perform inspection of each of the Fabry-Perot interference filter portions 1A and application of ink to the Fabry-Perot interference filter portion 1A determined as faulty, with high accuracy.

Moreover, according to the method of manufacturing the wafer 100, the gap S is formed in each of the Fabry-Perot interference filter portions 1A while the plurality of Fabry-Perot interference filter portions 1A is still in the state of the wafer 100. Accordingly, compared to a case of forming the gap S individually at a chip level, it is possible to form the gap S between the first mirror portion 31 and the second mirror portion 32 with significantly higher efficiency. Furthermore, since a process proceeds simultaneously in the effective area 101 at a portion corresponding to an arbitrary substrate 11 within the substrate layer 110 and portions corresponding to the surrounding substrates around the substrate 11, such as the etching of the intermediate layer 230 simultaneously performed onto the plurality of two-dimensionally arranged portions 50 expected to be removed, it is possible to reduce an unevenness of in-plane stress in the substrate layer 110. Therefore, according to the method of manufacturing the wafer 100, it is possible to obtain the wafer 100 capable of performing stable mass-production of high-quality Fabry-Perot interference filters 1.

Furthermore, application of the laser light L to form the modified region 7 inside the substrate layer 110 along each of the lines 5 and thereby cutting the wafer 100 along each of the lines 5 will be extremely effective in manufacturing the Fabry-Perot interference filter 1 because of the following reasons. That is, cutting the wafer 100 using the laser light L needs no water and thus can prevent an incidence of damage on the second mirror portion 32 floating on the gap S by water pressure and prevent sticking (phenomenon of stoppage of the second mirror portion 32 due to contact with the first mirror portion 31) caused by water intrusion into the gap S. Therefore, cutting the wafer 100 using the laser light L is extremely effective in manufacturing the Fabry-Perot interference filter 1.

[Modifications]

Although an embodiment of the present disclosure has been described as above, the present disclosure is not limited to the embodiment described above. For example, the material and the shape of each configuration are not limited to the materials and the shapes described above, and it is possible to employ various materials and shapes.

Furthermore, as illustrated in FIG. 18, the wafer 100 may include the modified region 7 formed inside the substrate layer 110 so as to correspond to the first groove 290. Here, forming the modified region 7 so as to correspond to the first groove 290 means that the modified region 7 is formed to overlap the first groove 290 when viewed in the facing direction, and in particular, means the modified region 7 is formed along each of the lines 5. This enables the cracks to be extended from the modified region 7 in a thickness direction of the substrate layer 110, making it possible to easily and accurately cut out a plurality of Fabry-Perot interference filters 1 from the wafer 100. In this case, the expanding tape 60 may be attached to the second surface 110b side of the substrate layer 110. At this time, the outer edge portion of the expanding tape 60 attached to the wafer 100 is held by an annular frame. This facilitates handling of the wafer 100 even in a state where the modified region 7 is formed inside the substrate layer 110. In the wafer 100 in which the modified region 7 is formed inside the substrate layer 110, there is a possibility that a crack would unexpectedly extend from the modified region 7. In the wafer 100, the plurality of dummy filter portions 2A, the first groove 290, and the second groove 470 are not provided in the pair of areas 102a of the dummy area 102. Accordingly, the extension of the crack will be stopped by the pair of areas 102a.

While the above embodiment mainly describes the inspection of the wafer implemented before the wafer is cut, it is also possible to implement both the inspection in the wafer state (inspection of the wafer) and the inspection after singulation (inspection of singulated Fabry-Perot interference filters).

Part of the configuration in one embodiment or the modification described above can be flexibly applied to the configuration in another embodiment or the modification.

REFERENCE SIGNS LIST

1: Fabry-Perot interference filter, 1A, 1Aa, 1Ab: Fabry-Perot interference filter portion, 22: first laminate, 24: second laminate, 24a: surface, 24b: through-hole, 31: first mirror portion, 32: second mirror portion, 100, 100A: wafer, 110: substrate layer, 110a: first surface, 110b: second surface, 220: first mirror layer, 240: second mirror layer, 532: ink, M: marking, S: gap.

The invention claimed is:
1. A wafer inspection method comprising:
a step of preparing a wafer including a substrate layer having a first surface and a second surface opposite to the first surface, a first mirror layer having a plurality of first mirror portions two-dimensionally arranged on the first surface, and a second mirror layer having a plurality of second mirror portions two-dimensionally arranged on the first mirror layer, in which a gap is formed between a portion of the first mirror layer at least including the first mirror portion and a portion of the second mirror layer at least including the second mirror portion facing each other so as to form a plurality of Fabry-Perot interference filter portions in which a distance between the first mirror portion and the second mirror portion facing each other varies by an electrostatic force;
a step of performing faulty/non-faulty determination of each of the plurality of Fabry-Perot interference filter portions; and
a step of applying ink to at least part of a portion overlapping the gap when viewed in a direction in which the first mirror portion and the second mirror portion face each other on the second mirror layer of the Fabry-Perot interference filter portion determined as faulty in the step of performing faulty/non-faulty determination.

2. The wafer inspection method according to claim 1, wherein the at least part of the portion to which the ink is applied includes a through-hole formed from a surface of the second mirror layer opposite to the first mirror layer to the gap.

3. The wafer inspection method according to claim 1,
wherein in the step of applying ink, the ink is sequentially applied to one or more Fabry-Perot interference filter portions determined as faulty, after completion of the faulty/non-faulty determination of all the Fabry-Perot interference filter portions in the step of performing faulty/non-faulty determination.

4. The wafer inspection method according to claim 1,
wherein in the step of applying ink, the ink is applied to one Fabry-Perot interference filter portion every time the one Fabry-Perot interference filter portion is determined as faulty in the step of performing faulty/non-faulty determination.

5. The wafer inspection method according to claim 1,
wherein viscosity of the ink before curing is in a range from 500 cP to 50000 cP.

6. A wafer comprising:
a substrate layer having a first surface and a second surface opposite to the first surface;
a first mirror layer having a plurality of first mirror portions two-dimensionally arranged on the first surface; and
a second mirror layer having a plurality of second mirror portions two-dimensionally arranged on the first mirror layer, wherein a gap is formed between a portion of the first mirror layer at least including the first mirror portion and a portion of the second mirror layer at least including the second mirror portion facing each other so as to form a plurality of Fabry-Perot interference filter portions in which a distance between the first mirror portion and the second mirror portion facing each other varies by an electrostatic force, and ink is applied to at least one faulty Fabry-Perot interference filter portion while the ink is not applied to at least one non-faulty Fabry-Perot interference filter portion, among the plurality of Fabry-Perot interference filter portions.

7. The wafer according to claim 6,
wherein the ink has penetrated into the gap formed in the faulty Fabry-Perot interference filter portion.

\* \* \* \* \*